(12) United States Patent  
Van Gestel

(10) Patent No.: US 7,709,360 B2
(45) Date of Patent: May 4, 2010

(54) METHOD FOR MANUFACTURING A CRYSTALLINE SILICON LAYER

(75) Inventor: Dries Van Gestel, Vosselaar (BE)

(73) Assignee: IMEC, Leuven (BE)

( * ) Notice: Subject to any disclaimer, the term of this patent is extended or adjusted under 35 U.S.C. 154(b) by 251 days.

(21) Appl. No.: 12/113,783

(22) Filed: May 1, 2008

(65) Prior Publication Data

US 2008/0268622 A1 Oct. 30, 2008

Related U.S. Application Data

(63) Continuation-in-part of application No. 11/146,564, filed on Jun. 7, 2005, now Pat. No. 7,662,702.

(60) Provisional application No. 60/577,556, filed on Jun. 7, 2004, provisional application No. 60/917,578, filed on May 11, 2007.

(51) Int. Cl.
*H01L 21/20* (2006.01)
*H01L 21/36* (2006.01)

(52) U.S. Cl. .............. 438/486; 438/488; 257/E21.133; 257/E21.297

(58) Field of Classification Search .......... 438/486, 438/488, FOR. 403, FOR. 405, FOR. 488; 257/E21.133, E21.295, E21.297
See application file for complete search history.

(56) References Cited

U.S. PATENT DOCUMENTS

| 3,961,997 | A | 6/1976 | Chu |
| 4,400,715 | A | 8/1983 | Barbee et al. |
| 4,818,337 | A | 4/1989 | Barnett et al. |
| 5,147,468 | A | 9/1992 | Deguchi |
| 5,844,351 | A | 12/1998 | Jones et al. |
| 5,952,242 | A | 9/1999 | Pietsch et al. |
| 6,099,662 | A | 8/2000 | Wang et al. |
| 6,241,817 | B1 | 6/2001 | Jang et al. |
| 2002/0025614 | A1 | 2/2002 | Jang et al. |
| 2006/0252235 | A1* | 11/2006 | Aberle et al. ............... 438/478 |

FOREIGN PATENT DOCUMENTS

| WO | WO 2004/033769 | 4/2004 |
| WO | WO 2004/033769 A | 4/2004 |

OTHER PUBLICATIONS

Bremhe et al., IEEE trans. el. Dev. 46 (1999) 2062.
Gall et al., Proceedings PV in Europe (2002) 87.
Harder et al., Proceedings 28th IEEE PVSC (2000).

(Continued)

*Primary Examiner*—Michelle Estrada
*Assistant Examiner*—Quovaunda Jefferson
(74) *Attorney, Agent, or Firm*—Knobbe Martens Olson & Bear LLP

(57) ABSTRACT

A method of forming a crystalline silicon layer on a microrough face of a substrate by reducing the microroughness of the face and then performing a metal induced crystallization process on the face is disclosed. The method further comprises, after metal induced crystallization and before removing the metal layer, removing silicon islands using the metal layer as a mask.

12 Claims, 32 Drawing Sheets

OTHER PUBLICATIONS

Pihan et al., "Formation of polycrystalline silicon on foreign substrates by combination of CVD and Aluminium-Induced crystallization techniques" Conference "PV in Europe", Rome 2002.

Pihan et al., "Polycrystalline Silicon Films on Ceramic Substrates by Aluminum-Induced Crystallisation Process," $3^{rd}$ World Conference on Photovoltaic Energy Conversion, May 11-18, 2003, Osaka, Japan 1182-1185.

Schneider, Jens, Masters Thesis entitled "Surface preparation of ALILE seed layers for polycrystalline silicon thin film solar cells," Technische Universitat Berlin, Sep. 5, 2002 (German language document; Concise explanation of the relevance attached).

Hattori, T., Editor, "Ultra clean surface processing of silicon wafers—secrets of VLSI manufacturing", Jan. 1, 1998, Springer-Verlag, Berlin, XP002549423, p. 60, lines 1-7.

Ishii et al., "Sub-5 mm thin film crystalline silicon solar cell on alumina ceramic substrate", Japanese Journal of Applied Physics, Japan Society of Applied Physics, Tokyo, JP, vol. 32, No. 6A, Part 02, Jun. 1, 1993, pp. L770-L773.

Letavic et al., "Recrystallized silicon-on-alumina as a monolithic circuit technology", IEEE 1989 MTT-S International Microwave Symposium Digest (Cat. No. 89CH2725-0) IEEE, New York, NY, USA, vol. 1, Jan. 1, 1989, pp. 969-972.

* cited by examiner

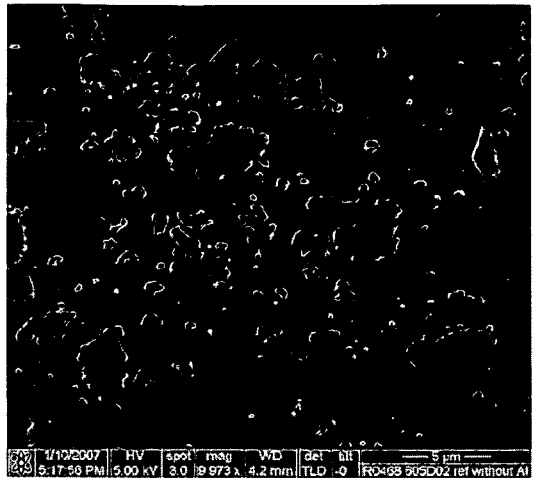 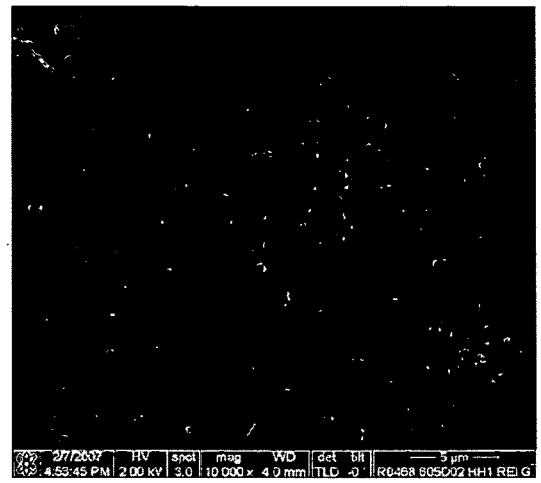
FIG. 32A  FIG. 32B
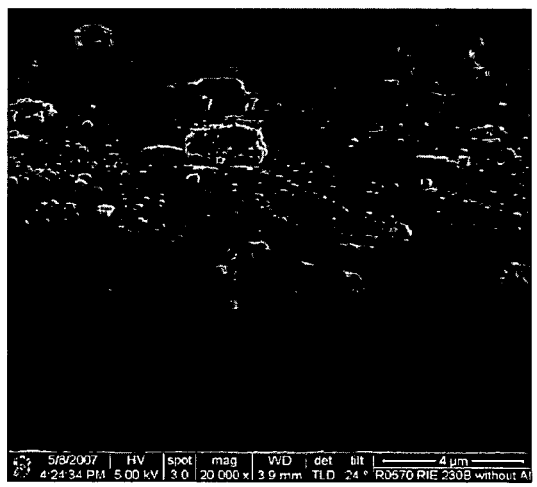 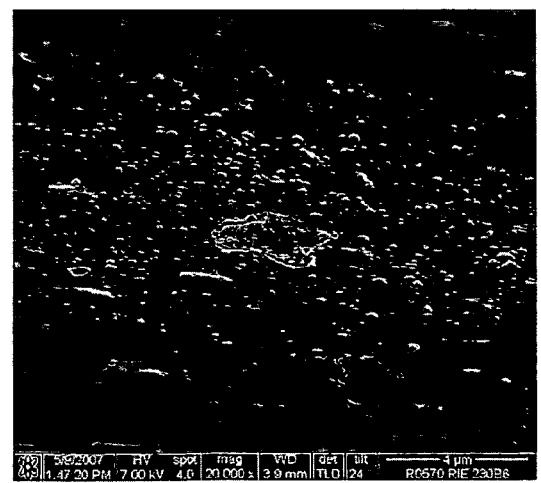
FIG. 32C  FIG. 32D

METHOD FOR MANUFACTURING A CRYSTALLINE SILICON LAYER

CROSS-REFERENCE TO RELATED APPLICATIONS

This application is a continuation-in-part of U.S. application Ser. No. 11/146,564, filed Jun. 7, 2005, which claims priority under 35 U.S.C. §119(e) to U.S. Provisional Application No. 60/577,556, filed Jun. 7, 2004. This application also claims priority under 35 U.S.C. §119(e) to U.S. Provisional Application No. 60/917,578, filed May 11, 2007. The disclosures of each of the foregoing applications are hereby incorporated by reference in their entireties and are hereby made a portion of this application.

FIELD OF THE INVENTION

Methods for manufacturing crystalline silicon layers on a substrate are provided, including a Metal Induced Crystallization process. The application of such methods in the manufacturing process of electronic devices such as solar cells is also provided.

BACKGROUND OF THE INVENTION

Thin-film crystalline Si solar cells on cheap foreign substrates are a promising alternative to traditional bulk crystalline silicon solar cells because of their higher potential for cost reduction. However, most of these approaches have led to devices with much lower efficiency than traditional solar cells. A major reason is the lower crystallographic quality of the layers obtained by deposition and/or crystallization.

One approach to crystallization is to use the metal-induced crystallization phenomenon (MIC), also known as metal induced layer exchange phenomenon, to create a thin layer with large grains, typically followed by epitaxial deposition. Examples of this technique are given in for instance S. Gall, J. Schneider, M. Muske, I. Sieber, O. Nast, W. Fuhs, Proceedings PV in Europe (2002) 87; N. P. Harder, J. A. Xia, S. Oelting, O. Nast, P. Widenborg, A. G. Aberle, Proceedings 28th IEEE PVSC (2000); S. Brehme O. Nast, D. Neuhaus, S. Wenham, IEEE trans. el. Dev. 46 (1999) 2062; all of which are incorporated herein by reference in their entirety.

One particular example of MIC is aluminum induced crystallization (AIC). AIC can be summarized as follows. First a metal layer, e.g. an aluminum layer, is deposited on a foreign substrate. Next, the metal layer, e.g. aluminum layer, is oxidized (for instance by exposure to air) to form a thin layer of metal oxide, e.g. aluminum oxide. Then, amorphous silicon is deposited on the metal oxide layer (e.g. an aluminum oxide layer). The sample is then annealed at a temperature below the eutectic point of the silicon-aluminum oxide.

During annealing, a layer exchange takes place: the silicon atoms diffuse into the metal layer (e.g. Al layer) and crystallize together. The metal atoms (e.g. Al atoms) move to the top surface. If the layer exchange process is successful, the final structure consists of a continuous layer of large grain polycrystalline silicon (e.g. typically with grain sizes in the range from 1 µm to 100 µm) on the foreign substrate covered by a metal layer (e.g. an Al layer) with Si enclosures. Typically the metal layer (e.g. Al layer) is then etched away. The resulting silicon layer or seed layer may contain some secondary crystallites that were formed in the top metal layer (e.g. Al layer) during crystallization. Secondary crystallites with vertical side walls and a smooth upper surface are often referred to as 'islands'.

An additional layer can be deposited epitaxially on the seed layer, reproducing the grain structure of the seed layer. The presence of secondary crystallites and/or islands on the seed layer may have a negative effect on the quality of the layer that is grown epitaxially on top of the seed layer. Therefore, a better epitaxial quality may be obtained if the secondary crystallites and/or islands are removed before epitaxial growth. For example, in Patent Application WO 2004/033769, the islands are removed after having removed the metal layer, e.g. aluminum layer, by a lift-off process. This island removal process is based on the presence of a thin aluminum hydroxide and/or aluminum oxide between the polycrystalline silicon film (basic seed layer) and the islands, and is therefore closely related to the AlC layer formation itself.

If the epitaxy process is done at low temperature (e.g. by using ECR PECVD or Ion-assisted deposition), low-cost glass can be used as a substrate. In the context of solar cell manufacturing, the use of glass substrates could lead to very low cost solar cells. However, low temperature epitaxy on imperfect surfaces presents a serious technological challenge.

Alternatively, the epitaxial growth can be done with a high temperature technique (e.g. thermal chemical vapor deposition). Using a high temperature technique has advantages (good epitaxial quality with simple process), but also imposes restrictions on the possible foreign substrates. Standard low-cost glass cannot be used because it cannot withstand high temperatures. Therefore ceramic substrates are often considered for the high temperature route. Aluminum-induced crystallization on ceramic substrates however results in an average grain size that is low (e.g., about 1 to 2 micron), and a high density of islands.

In "Formation of polycrystalline silicon on foreign substrates by combination of CVD and Aluminum-Induced crystallization techniques", E Pihan, A. Slaoui, M. Rusu, Conference "PV in Europe", Rome 2002, which is incorporated herein by reference in its entirety, nucleation and growth of polycrystalline silicon layers on foreign substrates using the aluminum induced crystallization process (AIC) of amorphous silicon is presented. The foreign substrates used are mullite ceramic substrates as well as thermally-oxidized silicon substrates. It is shown that the combination of AIC and thermal CVD can be applied on ceramic substrates, though the quality of the resulting crystalline silicon layer is much lower on the mullite substrates than on the thermally-oxidized silicon substrates, illustratively shown in FIG. 2 of this paper, because the density of grains on mullite substrates is much higher than the density of grains on thermally oxidized silicon substrates, and thus the grain size is much smaller.

Parameters that can define the quality of a crystalline film created by an MIC technique are grain size, continuity of the layer, island density, crystallographic properties (e.g., defects and grain boundaries) and electrical properties.

Crystals are referred to herein based on their grain sizes, as provided in Table 1. The term "crystalline silicon" refers to silicon of all crystal types, but excludes amorphous silicon.

TABLE 1

| Grain size of silicon crystal | Name |
| --- | --- |
| Atomic size | Amorphous |
| Atomic size—10 nm | Nanocrystalline |
| 10 nm-1 µm | Microcrystalline |
| 1 µm-100 µm | Polycrystalline |
| 100 µm-1 mm | Multicrystalline |
| Infinite | Monocrystalline |

While the above-described methods of MIC have produced crystalline silicon on foreign substrates, these techniques have not produced silicon layers with high enough crystalline quality for many uses, such as for use in solar cells. Accordingly, there is an unmet need for an improved method of forming crystalline silicon on foreign substrates.

SUMMARY OF THE INVENTION

One embodiment disclosed herein includes a method of forming a crystalline silicon layer on a face of a substrate, the face being microrough prior to forming the layer, the method comprising reducing the amount of microroughness on the face and performing a metal induced crystallization process on the face. In one embodiment, the reduction of the microroughness on the face is performed by depositing a microflattening layer on the microrough face. In one embodiment, the microflattening layer is a dielectric layer. In one embodiment, the dielectric layer comprises a spin-on dielectric, a flowable dielectric, a dip-on dielectric, or a spray-on dielectric. In one embodiment, the dielectric layer comprises a spin-on glass, $SiO_2$, or an oxide other than $SiO_2$. In one embodiment, the substrate comprises a ceramic material, glass, or a glass-ceramic material. In one embodiment, the substrate comprises mullite, alumina, or silicon nitride. In one embodiment, the face has a microroughness below 1 rad/μm after the step of reducing the amount of microroughness. One embodiment further comprises reducing the amount of macroflatness on the face prior to performing the metal induced crystallization process on the face. In one embodiment, the metal induced crystallization process is an aluminum induced crystallization process.

Performing a metal induced crystallization process may comprise depositing a metal, oxidizing the metal, depositing silicon on the metal and annealing the metal and the silicon, whereby a crystalline silicon layer is obtained and whereby a metal layer is obtained on the crystalline silicon layer, the metal layer comprising secondary crystallites and silicon islands. According to the preferred embodiments, the silicon islands may be removed before removing the metal layer, thereby using the metal layer as a mask. Removing the silicon islands using the metal layer as a mask may comprise performing an etching step with an etching agent etching silicon faster than the metal. The metal layer may then be removed after removing the silicon islands. Alternatively, the silicon islands and the metal layer may be removed simultaneously, for example by performing an etching step with an etching agent having substantially the same etching speed for silicon and for the metal.

Before removing the silicon islands an etching step may be performed for removing a layer, e.g. a metal oxide layer, covering the silicon islands. This etching step may for example comprise etching with HF and/or with $H_3PO_4$.

After removing the metal layer an annealing step may be performed at a temperature higher than 1000° C., 1020° C., 1040° C., 1060° C., 1080° C., 1100° C., 1120° C., 1130° C., thereby smoothening the surface of the seed layer. Annealing may for example be performed in a hydrogen atmosphere.

One embodiment further includes epitaxially depositing a silicon layer on the seed layer and constructing a solar cell from the substrate with crystalline silicon layer.

Another embodiment disclosed herein includes a wafer for use in a solar cell, including a substrate comprising a microrough face, a dielectric disposed on the microrough face, wherein the surface of the dielectric after deposition is less microrough than the microrough face, and crystalline silicon disposed on the dielectric.

BRIEF DESCRIPTION OF THE DRAWINGS

FIG. 11b is a SEM picture of the same area.

FIG. 8b is a SEM picture of the same area.

FIG. 10b is a SEM picture of the same area.

FIG. 32a is a top view SEM image of an AIC seed layer. On top of the almost continuous pc-Si basic seed layer, crystalline silicon islands were found. FIG. 32b is a top view SEM image of an AIC seed layer after selective plasma etching of the silicon islands followed by aluminum removal. FIG. 32c is a tilted view SEM image or an AIC seed layer after aluminum removal. On top of the almost continuous pc-Si basic seed layer, crystalline silicon islands were found. FIG. 32d is a tilted view SEM image of an AIC seed layer after selective plasma etching of the silicon islands followed by aluminum removal.

Figure 1:
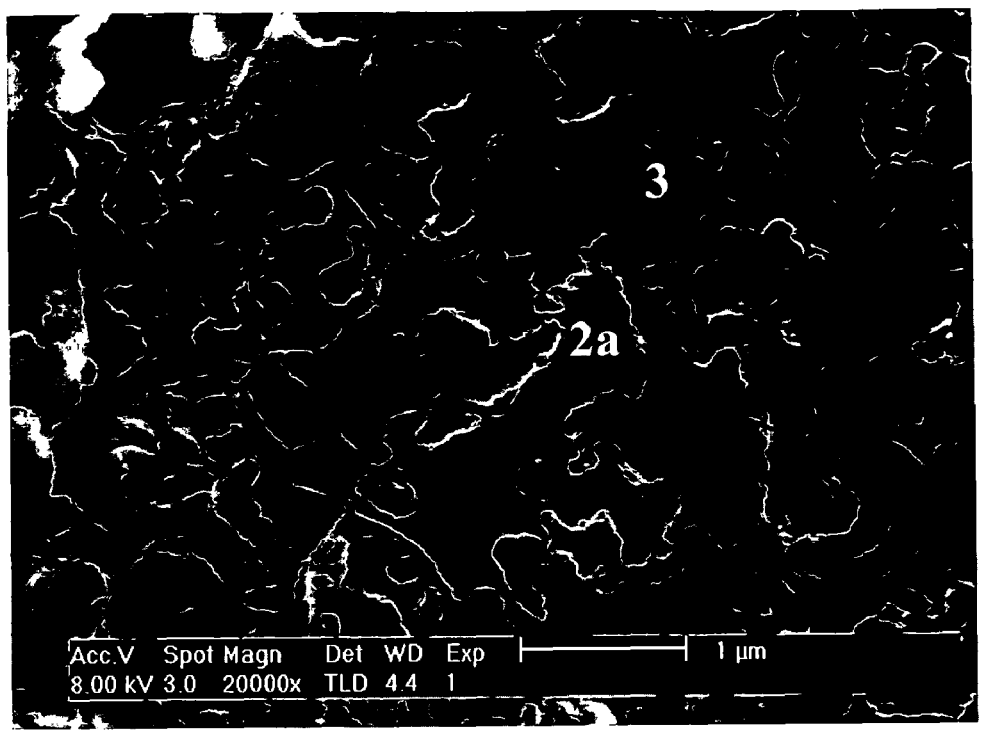
FIG. 1 is a SEM top view of an AIC layer formed directly on a ceramic (Alumina) substrate.

The figures with EBSD samples are depicted at the original aspect ratio and the x and y dimensions both have the same scale, as shown. The scale itself is part of the figures and is therefore not deformed.

DETAILED DESCRIPTION OF THE PREFERRED EMBODIMENT

Certain embodiments are described in detail below. It is apparent, however, that a person skilled in the art can imagine several other equivalent embodiments or other ways of executing the present invention, the spirit and scope of the present invention being limited only by the terms of the appended claims.

In one embodiment, a method is provided for improving the MIC formation of crystalline silicon on a substrate including AIC formation on microrough substrates such as ceramic substrates (e.g., mullite or alumina substrates). Without being limited to any particular theory, it is believed that the quality of the polycrystalline layer resulting from an MIC process, including the AIC process, is at least partially determined by the microroughness of the underlying layer. Accordingly, in one embodiment, a method is provided for forming a crystalline silicon layer on the face of a substrate that is microrough prior to forming the layer by reducing the amount of microroughness prior to formation of the silicon layer.

In one embodiment, the method comprises reducing the microroughness of a face of a substrate and then performing a metal induced crystallization process on the face. Different possibilities are disclosed for reducing the microroughness of the face. The surface can for example be polished or a microflattening layer may be deposited on the microrough face. The microflattening layer may be a dielectric layer, for example an oxide layer, but is not limited thereto. The intermediate dielectric layer may lead to a substrate surface with a smaller microroughness. Such a reduced microroughness can result in an MIC seed layer, e.g. an AIC seed layer, with much larger grains and a much lower islands density. After epitaxial deposition on the seed layer, a polycrystalline silicon layer on ceramic with large grain size may thus be obtained. In some embodiments, the grain size obtained is larger than 5 μm.

The initial microrough substrate may comprise a ceramic material, glass or a glass-ceramic material. The substrate can be any microrough substrate. Preferably it comprises mullite, alumina or silicon nitride. In some embodiments, any reduction of microroughness of the underlying layer or substrate results in a better performance of the MIC, e.g. AIC, process on top. The value μRN (as defined below) may be used to indicate on which substrate MIC, e.g. AIC, will give the best results. An additional microroughness reducing step can be applied. The same step may have a different impact on the microroughness of different substrates.

In embodiments the macro roughness of the substrate may be reduced prior to performing the metal induced crystallization process.

Since the μRN parameter only takes into account geometric features of a substrate surface, it is believed that its use is even more appropriate when comparing values on the same types of substrates, or still more appropriate when comparing values on a single substrate before and after a microflattening step. It can of course also be used to develop techniques for performing microflattening steps.

The dielectric may comprise a spin-on dielectric, e.g. spin-on oxide, a flowable dielectric, e.g. flowable oxide (which can sometimes also be a spin-on oxide), a dip-on dielectric, e.g. dip-on oxide, or a spray-on dielectric, e.g. spray-on oxide. In some embodiments, the dielectric may comprise a spin-on glass or $SiO_2$.

The metal induced crystallization process may be an aluminum induced crystallization process. The preferred embodiments are described herein for the case of aluminum induced crystallization. However, it can more generally be applied for Metal Induced Crystallization processes wherein other materials than aluminum may be used, such as for example Ag, Au, Sb, In, Pd, Ti, Ni or Cu.

The metal or Aluminum induced crystallization process is known in the art, and typically comprises the steps of (e.g. AIC):

a. metal layer, e.g. aluminum layer, deposition on a foreign substrate;
b. metal layer, e.g. aluminum layer, oxidation, for example by exposure to air, to form a thin layer of metal oxide, e.g. aluminum oxide;
c. amorphous silicon deposition on the layer of metal oxide, e.g. aluminum oxide;
d. annealing at a temperature below the eutectic point;
e. metal, e.g. Al, removal.

During annealing a layer exchange takes place: the silicon atoms diffuse into the metal layer, e.g. aluminum layer, while the metal atoms, e.g. Al atoms, move to the top surface. In case the layer exchange process is successful, the final structure consists of a continuous layer of large grain polycrystalline silicon (e.g. grain sizes in the range between 1 μm and 100 μm) on the substrate covered by a metal layer, e.g. Al layer, generally with silicon enclosures or secondary crystallites. Secondary crystallites with substantially vertical side walls and a smooth upper surface, which are reaching through the metal layer, e.g. Al layer, are herein referred to as silicon islands. For the purpose of the present description the seed layer is considered as comprising a basic seed layer and, if present, secondary crystallites on top of the basic seed layer. The secondary crystallites can be islands.

Under the islands or secondary crystallites a thin layer is typically present. When the metal layer is aluminum this thin layer may comprise aluminum oxide (e.g. $Al_2O_3$) with a thickness for instance in the range between 1 nm and 20 nm, e.g. in the range between 2 nm to 8 nm. It may be difficult to remove this thin layer.

The resulting seed layer can then advantageously be used for further epitaxial layer deposition, reproducing the grain structure of the seed layer, resulting in a polycrystalline layer of high quality. This epitaxially deposited layer can then for example advantageously be used for solar cell applications and manufacturing.

It was found that the silicon islands and secondary crystallites present on the surface of the basic seed layer may have a negative influence on the quality of the epitaxial layer grown on top of the seed layer. Due to their different orientation compared to the seed layer they may give rise to additional grain boundaries and stress in the epitaxial layer. Furthermore, due to their presence the starting surface for epitaxial growth may be rough. Therefore the islands may be preferably removed before epitaxial growth.

In a further aspect, the islands may be removed from the seed layer before depositing an epitaxial silicon layer. Removing the islands may be done before removing the aluminum layer, thereby using the aluminum layer as a mask for selectively removing, e.g. etching, the silicon islands. The aluminum layer may be removed after having removed the silicon islands or it may be removed simultaneously with removing the silicon islands. The aluminum layer may protect the underlying polycrystalline silicon basic seed layer during etching.

In a further aspect, the seed layer may be annealed in a hydrogen atmosphere at high temperatures, e.g. at temperatures higher than 1000° C., 1020° C., 1040° C., 1060° C., 1080° C., 1100° C., 1120° C., 1130° C., thereby smoothening the surface of the seed layer.

In some embodiments, a solar cell is manufactured from the resulting silicon layer. Any standard solar cell processing can be performed, such as for example: phosphor diffusion emitter or heterojunction emitter, bulk and surface passivation, metallization, and isolation of the cells.

As used herein, a "microrough" surface is a surface which has a roughness at a microscopic scale. Microroughness differs from roughness typically referred to in the art as RMS roughness (i.e., macroroughness). A surface can be macrorough but not microrough. Alternatively, a surface can be macroflat and at the same time microrough.

Figure 15:
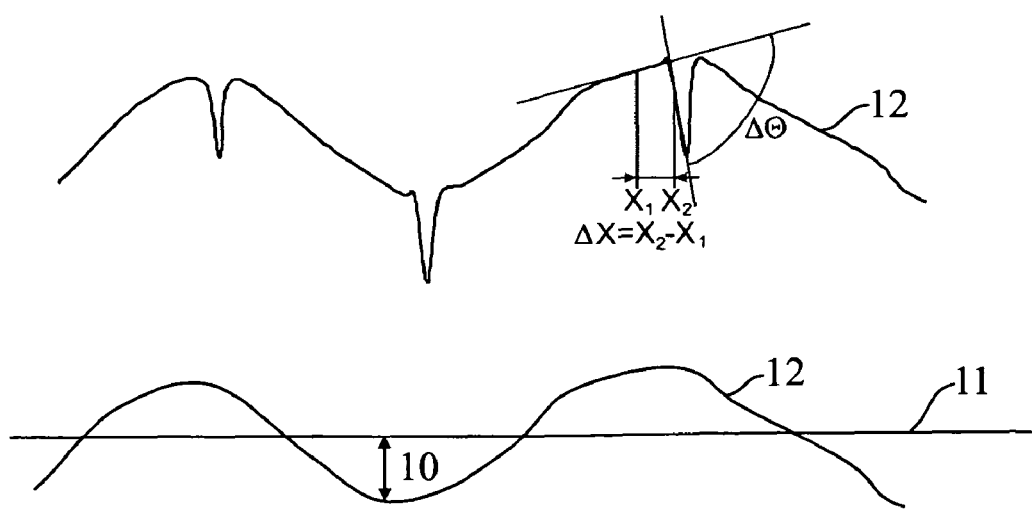
FIG. 15 is an illustration of the difference between macroroughness and microroughness; both surfaces illustrated are rough and have about the same RMS roughness. Their microroughness differs though, the upper part of the drawing showing a larger microroughness than the bottom part, resulting in different MIC process qualities.

The degree of macroroughness can be quantified by the maximum deviation from an average level line 11, as illustrated in FIG. 15. An average level line 11 is a reference line from which profile deviations are measured. As an average level line 11, one can use the least squares mean line, which is a line through a profile 12 such that the sum of the squares of the deviations 10 of the profile from the average level line 11 is minimized. A measure for the macroroughness can be the maximum deviation from this average level line 11.

An average level line 11 can be determined from cross-sectional SEM or TEM pictures over a distance of minimum 1 μm and long enough to have a characteristic profile for the sample (typically maximum 15 μm). A surface is defined as macrorough when the maximum deviation from the average level line 11 exceeds 50 nm. If not, the surface is defined to be macroflat.

In FIG. 15, the difference between macroroughness and microroughness is illustrated. Both profiles 12 illustrated are macrorough and have about the same RMS roughness. However, the top profile 12 has a larger microroughness than the bottom profile 12.

The degree of microroughness can be quantified by the parameter μRN, defined as the relative mean distance and variance between two side by side microrough defects along a characteristic profile line of the surface. As illustrated in FIG. 15, a microrough defect is a place were |ΔΘ/Δx| is higher than a threshold value, where ΔΘ is the angle between two tangential lines to a characteristic profile line 12 of the surface at two points $x_1$ and $x_2$, and $\Delta x = x_2 - x_1$ is the distance between the orthogonal projections of the two points $x_2$ and $x_1$ onto a parallel of a least square fitted straight line of the characteristic profile line 12. In one embodiment, the threshold value is higher than about 1 rad/μm, preferably higher than about 2 rad/μm. In one embodiment, Δx is on the order of between about 0.03 μm and about 0.5 μm, preferably between about 0.05 μm and about 0.3 μm, typically about 0.1 μm. A surface is considered "microrough" if any location on the surface can be found where |ΔΘ/Δx|>1 rad/μm.

The relative mean distance between two microrough defects can be calculated from a characteristic profile line for the sample, having a length L measured along a least square fitted straight line of the surface, with a resolution between about 5 nm and about 20 nm over the surface in consideration. The profile line can be divided into L/Δx equal parts and the value |ΔΘ/Δx| can be calculated for every part. It can then be determined if the calculated value is higher than the desired threshold value or not. L/Δx may be large enough in order to allow statistical analysis. Once microrough defects are identified using |ΔΘ/Δx| values, it is possible to calculate the mean distance $d_m$ between two side-by-side microrough defects along the characteristic profile. To get the relative mean distance, the mean distance $d_m$ can be divided by L (e.g., μRN=$d_m$/L), resulting in a value between 0 and 1. Higher values indicate a lower microroughness of the sample. Lower values indicate a higher microroughness of the sample. Those of skill in the art will appreciate other methods for measuring and estimating microroughness.

In one embodiment, the values of Θ can be determined from a cross-sectional profile of the sample with resolution between 5 nm and 20 nm, such as may be obtained using a cross-sectional transmission electron microscope.

The bulk of prior uses of AIC have used glass substrates. It is however not straightforward to extend this experience to ceramic substrates. The conditions are very different. Whereas glass substrates usually have a very flat surface (macroroughness below 10 nm and microflat), the ceramic substrates show a large macroroughness, ranging from 50 nm up to microns and are moreover microrough. This surface structure results from the sintering process which occurs during ceramic production. For example, the alumina substrates described herein had a peak to peak roughness of about 400 nm (RMS roughness~80 nm). Moreover, ceramic consists at least in part of a crystalline phase, in contrast to the amorphous structure of glass.

In some embodiments, ceramic substrates are used with methods described herein. In some embodiments, the ceramic substrates have a high temperature resistance and have desirable thermal expansion, chemical stability, and optical properties. In various embodiments, the ceramic substrate is alumina (microcrystalline aluminum oxide) or mullite (mixture of $SiO_2$ and $Al_2O_3$). The polishing of mullite substrates leads to large open porosity (pores several microns deep and wide), which cannot be excluded with polishing (see e.g., FIG. 12, FIG. 13, and FIG. 14). The quality of the MIC film, e.g. AIC film, can be evaluated on the mullite material between these large pores.

In some embodiments, silicon layers on a substrate whose microroughness has been reduced are used to manufacture a solar cell. Any solar cell manufacturing techniques known in the art may be used.

EXAMPLES

Where alumina substrates were used, they were ADS996 substrates from CoorsTek. Double layers of aluminum and amorphous silicon were deposited one after the other, allowing the aluminum layer to get oxidized between the two depositions by a 2 min exposure to air. The aluminum deposition was done in an electron-beam, high-vacuum evaporator. The amorphous Silicon layer was either deposited in the same evaporator, or in a parallel plate plasma-enhanced CVD system from silane decomposition. A typical stack was 200 nm Al and 230-250 nm Si. These structures were then annealed in a tube furnace under nitrogen at 500° C. for a period of 30 min to 4 hours. During the annealing, crystalline silicon grains are formed in the bottom layer while Al atoms move to the top surface, eventually resulting in a layer exchange. The top Al layer was then removed in a chemical solution containing phosphoric acid.

Example 1

AIC on Bare Ceramic Substrate 1a (Comparative Example)

The morphology of a typical sample obtained with the procedure described above can be seen in the SEM picture in FIG. 1. The AIC seed layer 2a as such is not clearly visible in this picture. The reason is that the layer 2a is covered by numerous 'islands' 3, the secondary crystallites formed within the top layer during the AIC process. Close observation with SEM and TEM analysis reveals that the grain size in the AIC seed layer 2a is around 1-2 μm. This grain size is substantially lower than reported results on glass. There appears to be much more nucleation taking place when the AIC is done on a ceramic substrate 1a, both in the bottom layer (leading to a small grain size) and in the top layer (leading to a high density of islands).

Example 2

Intermediate Layer Applied in Order to Reduce the Microroughness

Figure 2:
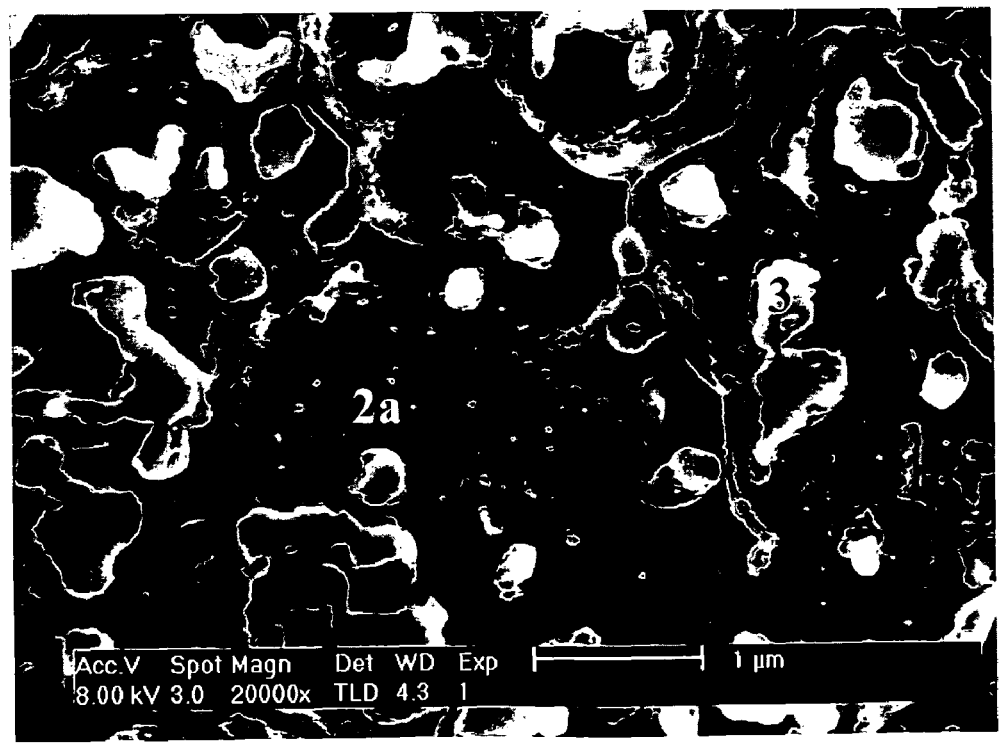
FIG. 2 is a SEM top view of an AIC layer formed on a ceramic substrate covered by pyrolithic oxide.
Figure 3:
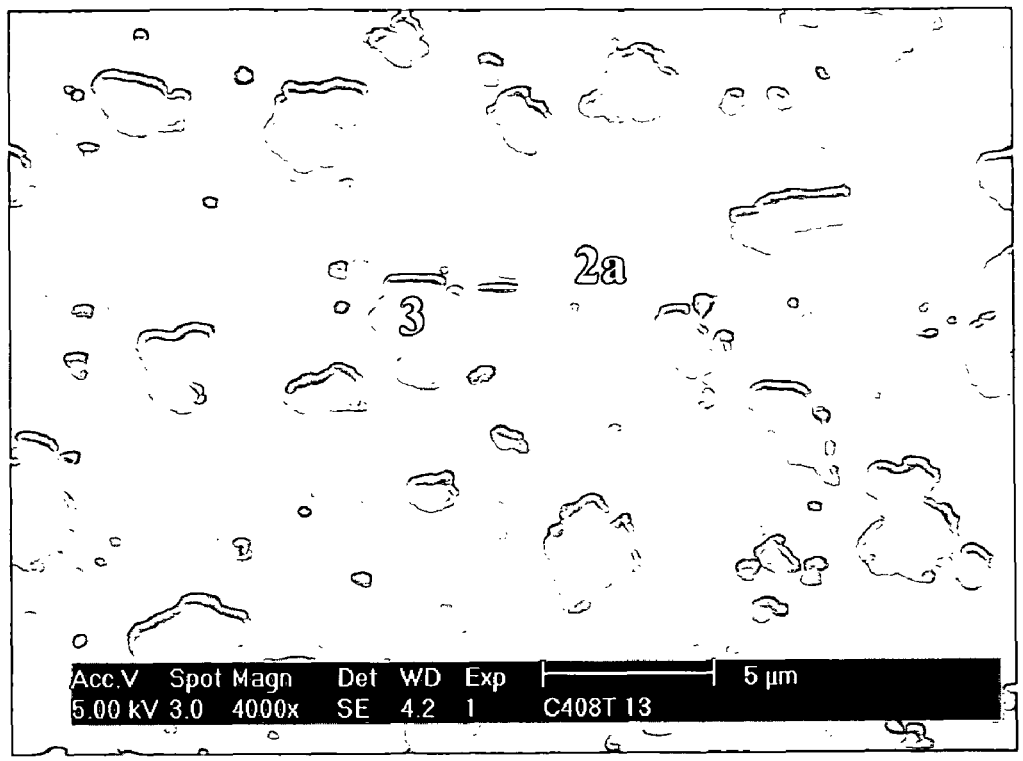
FIG. 3 is a SEM top view of an AIC layer formed on a ceramic substrate covered by a spin-on flowable oxide.
Figure 4:
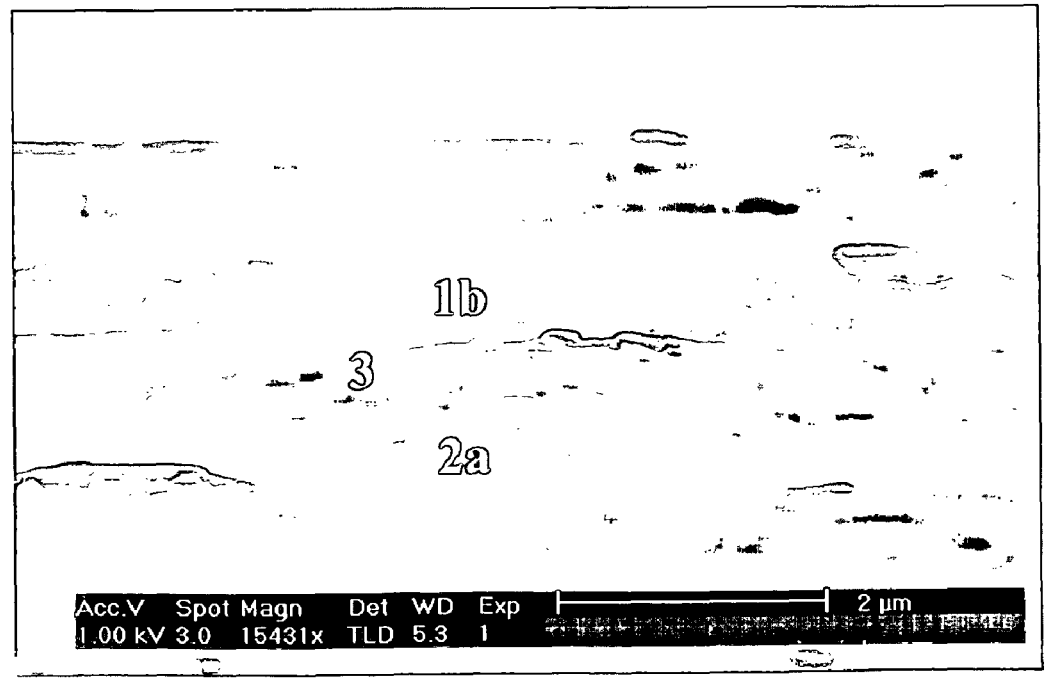
FIG. 4 is a SEM picture of a thin silicon grain formed by AIC on a spin-on oxide coated ceramic substrate.

An intermediate silicon oxide layer was introduced between the substrate 1a and the AIC layers. Two different types of oxide were used. One type was a pyrolithic oxide ('pyrox') deposited by the decomposition of silane at atmospheric pressure and 400° C. The second type was a spin-on flowable oxide (FOx-23 from Dow Corning), cured at 400° C. Pyrox was densified at 950° C. and the spin-on flowable oxide at 900° C. before the deposition of the AIC stack. SEM pictures of these samples are shown in FIG. 2 and FIG. 3, respectively. The density of islands 3 decreased significantly compared to Example 1, by about a factor two for the intermediate pyrox layer (FIG. 2), and another factor 2 for the spin-on oxide layer (FIG. 3). The appearance of the latter samples is however completely different. Because there are much less islands 3 in the case of the spin-on oxide, the structure of the main AIC seeding layer 2a is clearly visible and is in fact reminiscent of what is obtained on glass substrates. The layer 2a consists of roughly circular large grains (>5 μm), the growth of which is stopped by the encounter with a neighboring grain. If the process is not allowed to proceed to full completion, or, as for these samples, the excess of Si is not sufficient, holes remain in the AIC seed layer 2a. The different features are even more evident in the tilted view of an AIC grain on a ceramic substrate 1a with intermediate spin-on oxide 1b as depicted in FIG. 4. One single large grain is seen in the centre of this picture, the surface of the substrate 1a being visible all around it. It is interesting to note that the surface of the substrate 1a is clearly not macroflat, but shows substantial waviness and thus RMS roughness. The peak to peak roughness is still larger than 100 nm. Nevertheless, the AIC grain growth proceeds along the substrate surface, resulting in a single grain. Without being bound to any particular theory, it is believed that this result is because the surface is microflat due to the spin-on oxide layer.

Although the SEM picture in FIG. 4 shows a not yet complete AIC seed layer 2a, it is relatively simple to achieve such a complete layer by tuning the properties of the AIC stack.

Example 3

Epitaxial Silicon Deposition

After removal of the metal layer obtained on top of the stack at the end of the MIC process, e.g. an Al layer in case of an AIC process, high temperature CVD was used to deposit an epitaxial layer on top of the seed layer 2a, an established technique common in the microelectronics processing. AIC seed layers 2a were prepared on spin-on flowable oxide 1b covering 5×5 cm² alumina samples 1a following the procedure described above. The conditions were such that the AIC layers 2a covered the complete surface. No attempt was made at removing the islands 3 from the seed layer 2a. Si layers 2b were deposited on these samples in a commercial single-wafer epitaxial reactor (Epsilon ASM) with trichlorosilane diluted in $H_2$, at atmospheric pressure and at a temperature of 1130° C. The deposition rate was 1.4 μm/min. In situ doping with B was done by adding diborane to the gas flow, so as to form double layers with a 0.5-3 μm thick p+ region ($\sim 10^{19}$ cm$^{-3}$) and a 0.5-3 μm thick p region (variable doping).

Figure 5:
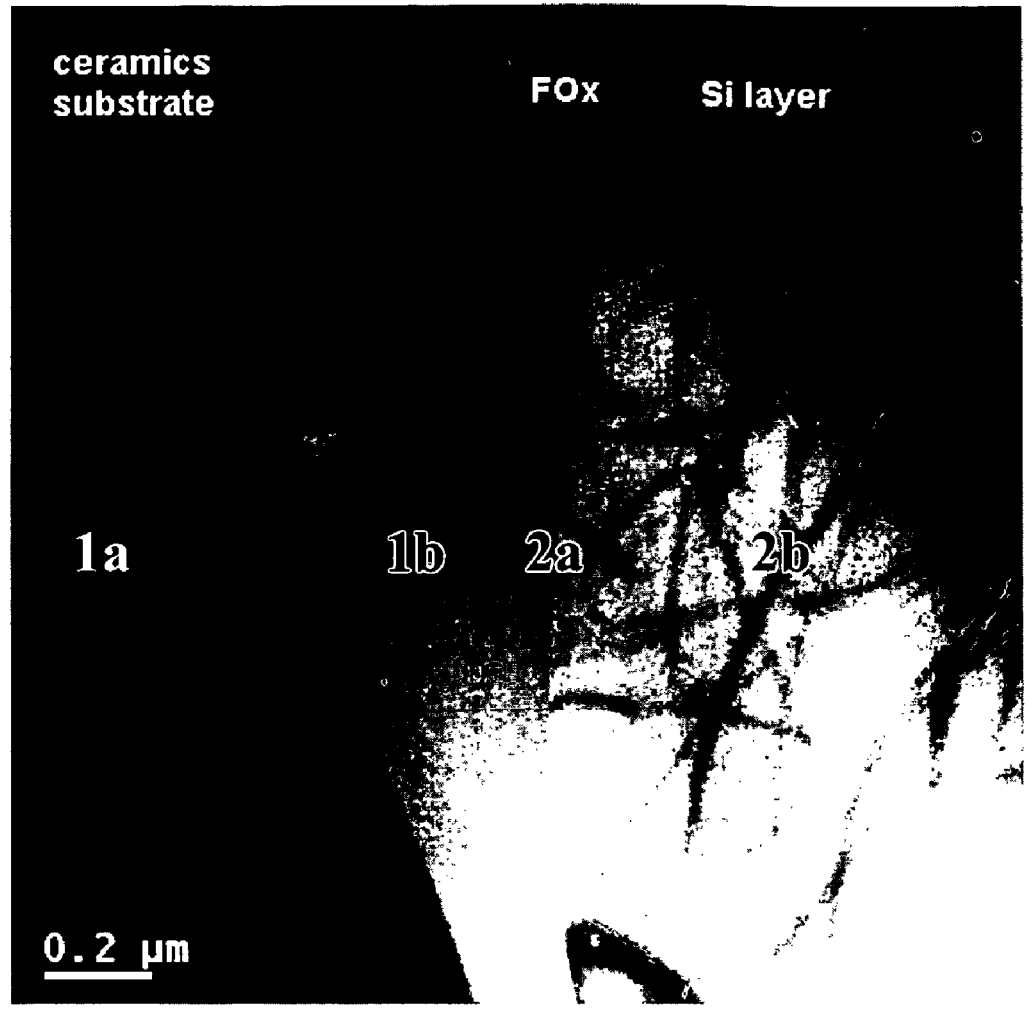
FIG. 5 is a TEM picture of a sample with structure ceramic/spin-on oxide/AIC/epitaxial layer.

A TEM cross-section of a sample with a structure comprising alumina ceramic 1a/spin-on flowable oxide 1b/AIC seed layer 2a/epitaxial layer 2b is shown in FIG. 5. The intermediate spin-on oxide 1b reduced the microroughness but did not completely flatten the substrate's surface. The quality of the epitaxial layer 2b appeared very good. The seed layer 2a could not be distinguished from the epitaxial layer 2b, no interface between the two regions being visible. The cross-sections show a very low defect density. The bent diffraction lines visible in FIG. 5 do indicate that there is substantial stress in the layer. No needle-like grains, (as would be expected as a result of epitaxy on islands 3) were observed.

Figure 6:
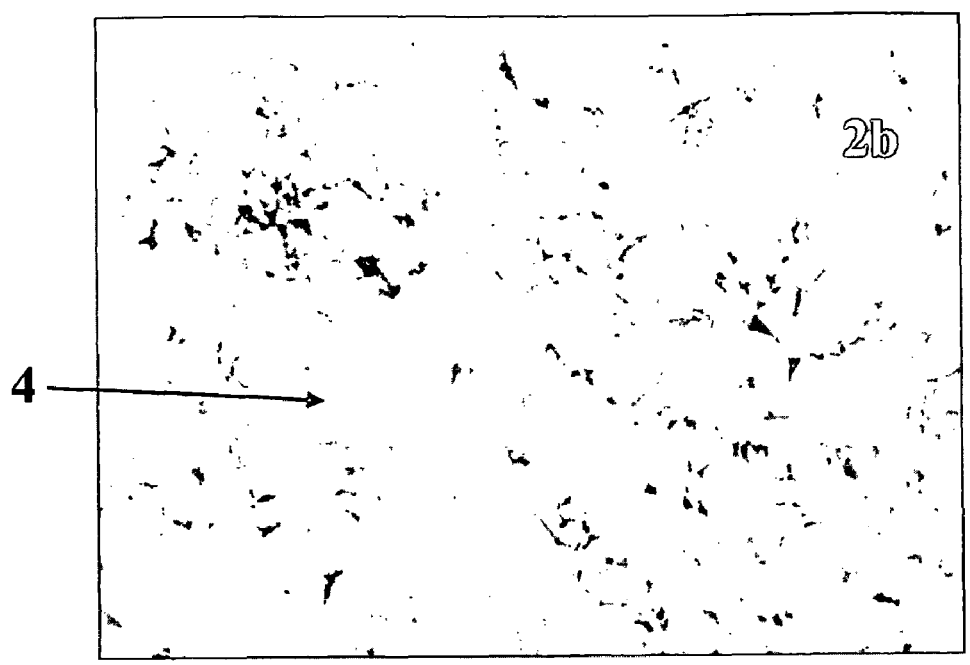
FIG. 6 is an optical microscope picture of an epi layer grown on an alumina ceramic/spin-on oxide/AIC seed layer sample, after polishing and Secco etch. SIMS measurements were carried out on such a sample. The dopant profile was as expected. The oxygen concentration was found to be constant throughout the layer at around $6 \times 10^{17}$ cm$^{-3}$.

To determine the grain size and observe the grain size distribution, the Si layer 2b of some of the samples was polished, a defect etch was applied and these planar sections were studied under an optical microscope (see FIG. 6). The nominal grain size as determined by the grain boundary 4 counting technique was about 5 μm, while some grains reach 10 μm diameter or even larger.

Example 4

Solar Cell Processing

Any standard solar cell manufacturing technique can be used to produce photovoltaic cells as solar cells from the structures obtained as described above. The present example was performed to illustrate the quality of the epitaxial layer 2b. From samples with the structure ceramic 1a/spin-on oxide 1b/AIC seeding layer 2a/epitaxial layer 2b, simple mesa cells were made (1×1 cm², base contact at the periphery of the cell) with the following process:

1. emitter diffusion: P-diffusion from a P-doped pyrolithic oxide;
2. bulk and surface passivation: hydrogenation and nitride deposition in a PECVD system;
3. mesa etching: definition of the cell area (1 cm²) by photolithography and etching in a silicon etch solution;
4. side contact formation: shadow evaporation of Al and sintering;
5. emitter contact formation: photolithography, evaporation of a Ti/Pd/Ag stack and lift-off The mesa structure is useful for relatively fast experiments to assess the quality of the material, but has an intrinsic limitation. The majority carriers (holes) have to travel a large distance to reach the base contact at the periphery over a path with low conductance (e.g., the thin p+ layer). Therefore a high series resistance was expected.

Table 2 shows the illuminated IV parameters of these solar cells for various doping levels. Although the best efficiency with a diffusion emitter was 5.0%, with a $V_{oc}$ of 460 mV, the shunt resistance was not a problem, with $R_{sh}$ above 1000 ohm cm² for all samples. The series resistance was, as expected, rather high, exceeding 3 ohm cm² for the best cell. The base doping level appears to have a minor impact on the cell parameters.

TABLE 2

| $N_{base}$ (cm$^{-3}$) | $J_{SC}$ (mA/cm²) | $V_{OC}$ (mV) | FF (%) | Eff. (%) |
|---|---|---|---|---|
| 5 × 10$^{15}$ | 16.0 | 410 | 62.6 | 4.1 |
| 1 × 10$^{16}$ | 16.3 | 411 | 62.7 | 4.2 |
| 3 × 10$^{16}$ | 16.6 | 412 | 61.3 | 4.2 |
| 1 × 10$^{17}$ | 16.1 | 428 | 61.2 | 4.2 |

These results are the best reported on ceramic substrates for techniques where no silicon (re-)melting is involved. The $V_{oc}$ in the range 410-460 mV is dominated by recombination in the junction space charge region and indicates a low minority carrier lifetime. Using Taretto's formula for determination of the effective diffusion length from IV parameters [U. Rau K. Taretto, J. H. Werner, J. Appl Phys. 93 (2003) 5447, which is incorporated herein by reference in its entirety], a $L_{eff}$ of 1.3 μm was found. This result was based on some assumptions about not well-known material parameters (e.g. electron mobility), but clearly indicates that the diffusion length is at present substantially lower than the active layer thickness.

Example 5

Comparison Experiments

Additional experiments were performed to compare the results obtained with and without lowering the substrate microroughness. The samples prepared are listed in Table 3.

TABLE 3

Figure 7:
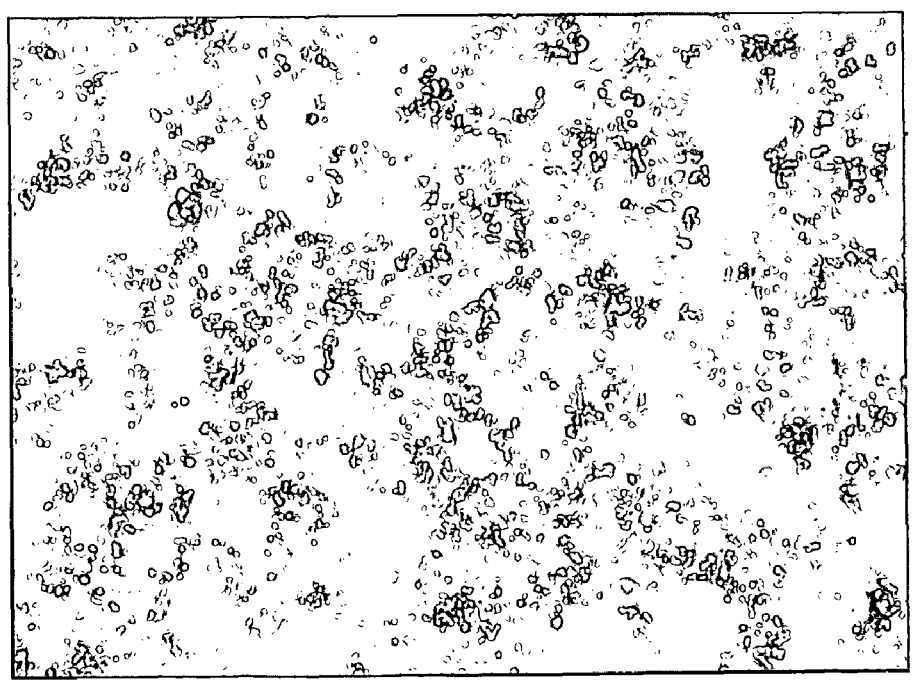
FIG. 7 shows an optical microscope picture of sample 4: non-polished mullite/AIC.
Figure 8A:
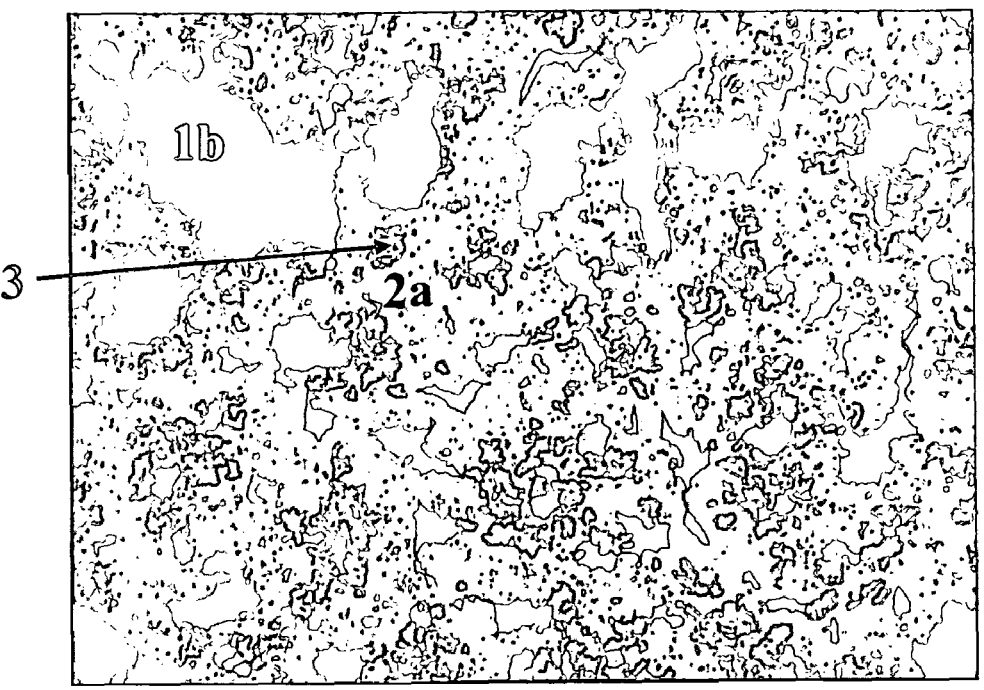
FIG. 8a shows an optical microscope picture of sample 1: polished mullite/AIC.
Figure 9:
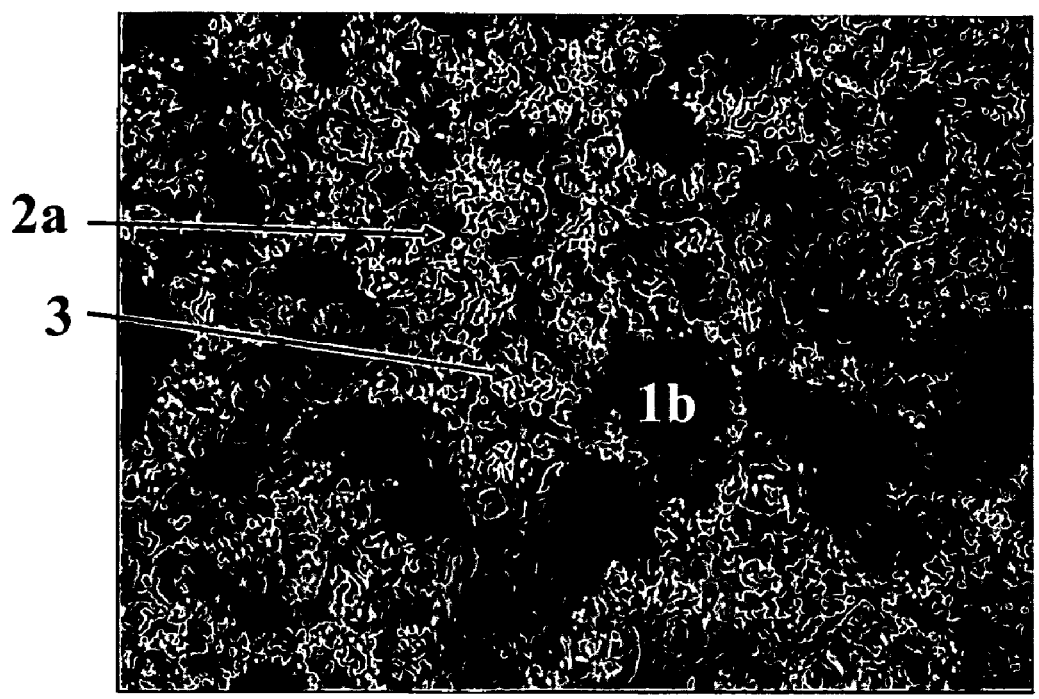
FIG. 9 shows an optical microscope picture of sample 8: non-polished mullite/spin-on oxide/AIC
Figure 10A:
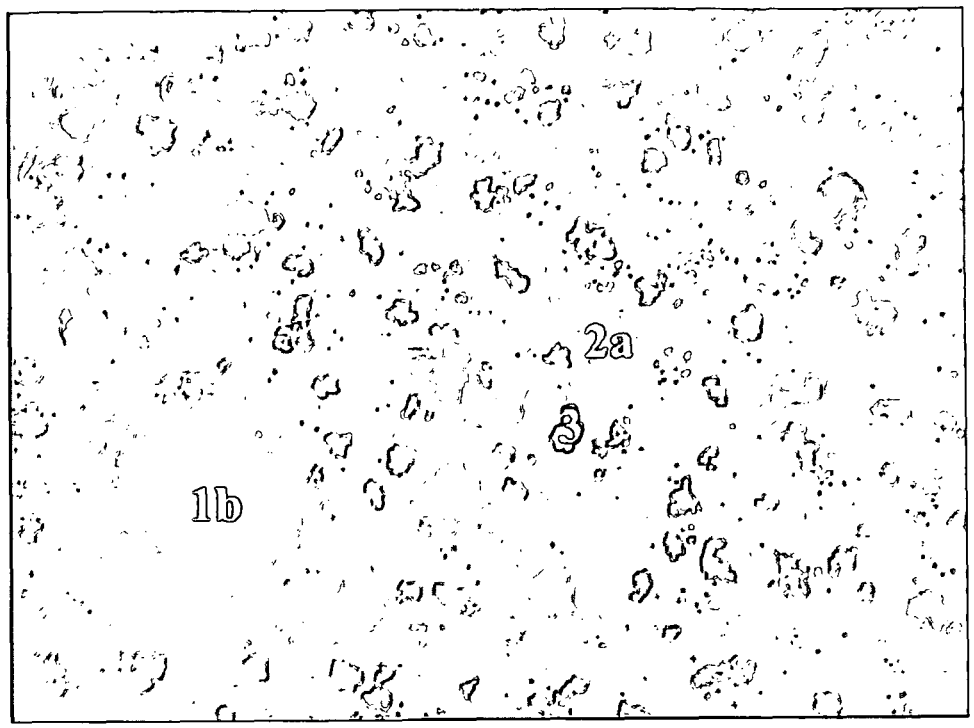
FIG. 10a shows an optical microscope picture of sample 5: polished mullite/spin-on oxide/AIC.
Figure 11A:
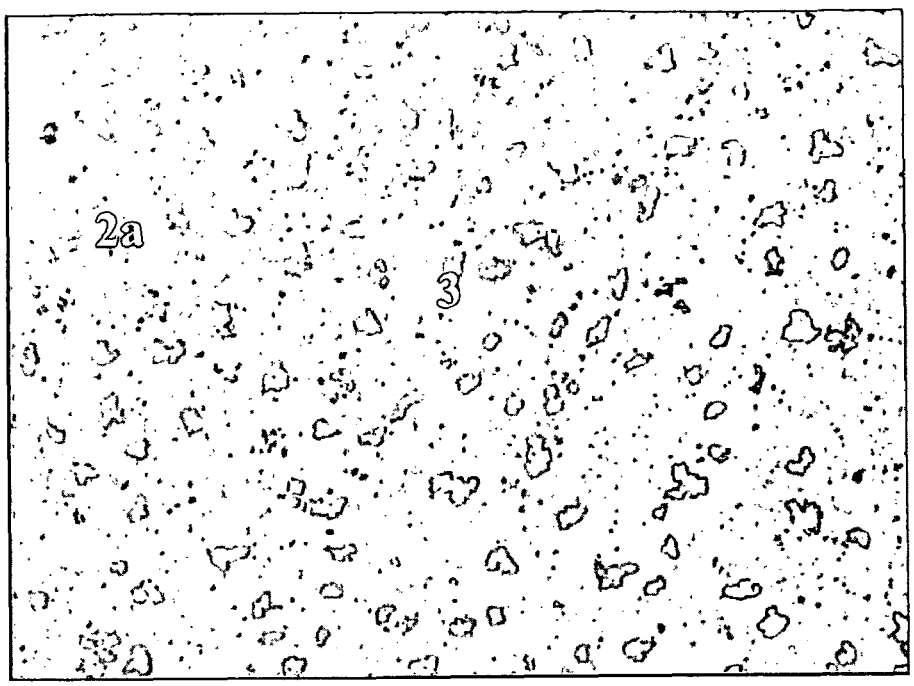
FIG. 11a shows an optical microscope picture of sample 9: alumina/spin-on oxide/AIC.

| Sample | Substrate | Oxide layer | AIC layer |
|---|---|---|---|
| 1, FIG. 8a | mullite polished | No | 200 nm Al 230 nm Si |
| 4, FIG. 7 | mullite not polished | No | 200 nm Al 230 nm Si |
| 5, FIG. 10a | mullite polished | Flowable Oxide (Fox) | 200 nm Al 230 nm Si |
| 8, FIG. 9 | mullite not polished | Fox | 200 nm Al 230 nm Si |
| 9, FIG. 11a | Alumina | Fox | 200 nm Al 230 nm Si |

All pictures shown in the respective figures were taken with an optical microscope with the same magnification. The long side of the pictures corresponds to a distance of 127 μm and the short side to a distance of 95.5 μm.

Figure 12:
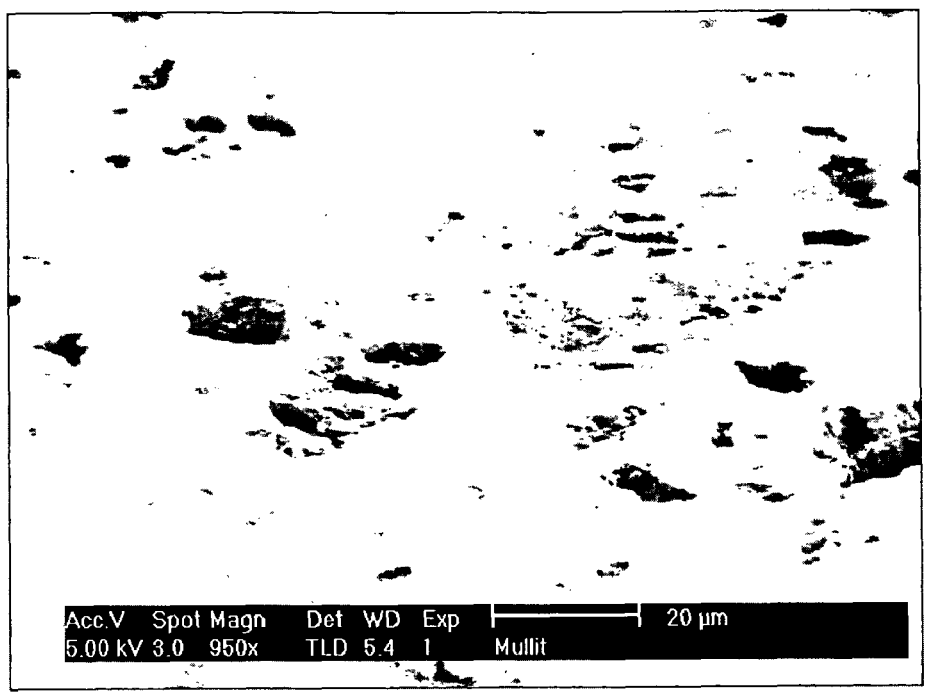
FIG. 12 is a SEM tilted view of a polished mullite sample.
Figure 13:
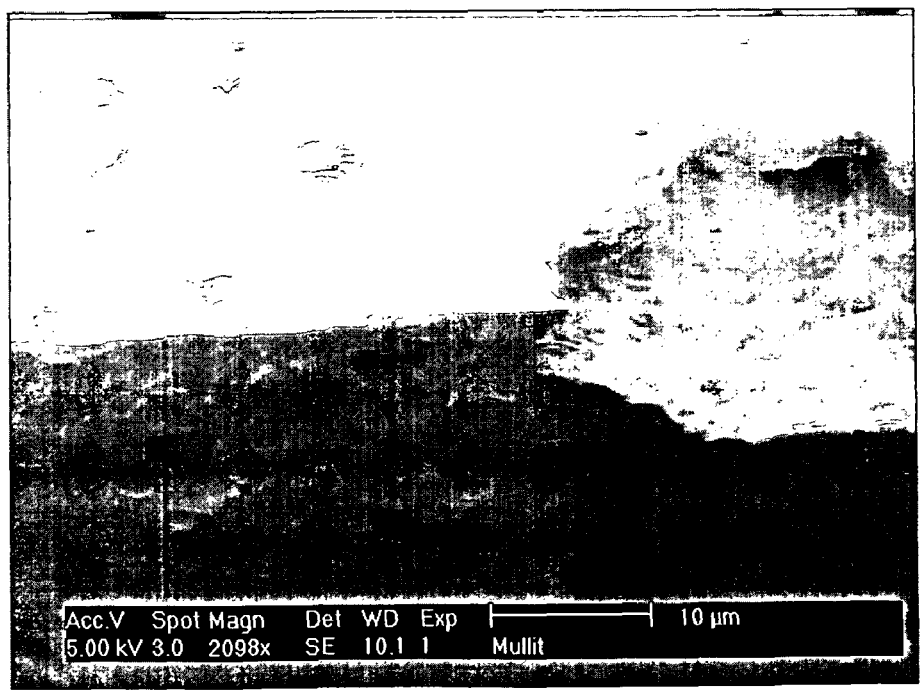
FIG. 13 is a SEM tilted cross-section of a polished mullite sample.
Figure 14:
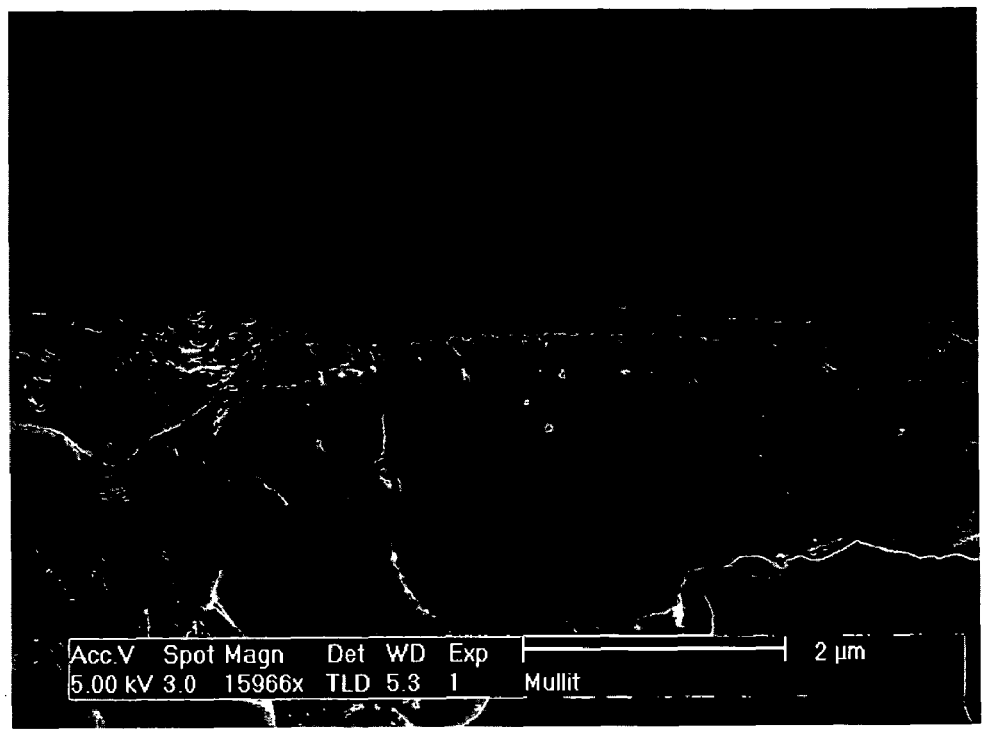
FIG. 14 is a SEM cross-section of a polished mullite sample.

The ceramic substrates used in these experiments were commercial mullite substrates. The polishing of these substrates led to large open porosity (pores several microns deep and wide), as illustrated in FIG. 12, FIG. 13 and FIG. 14. Therefore, the quality of the AIC film was evaluated on the material between these large pores.

Comparison—MIC Directly on Polished and Non-Polished Substrates (No Intermediate Micro Flattening Layer e.g. Spin-On Oxide, Being Applied)

Figure 24:
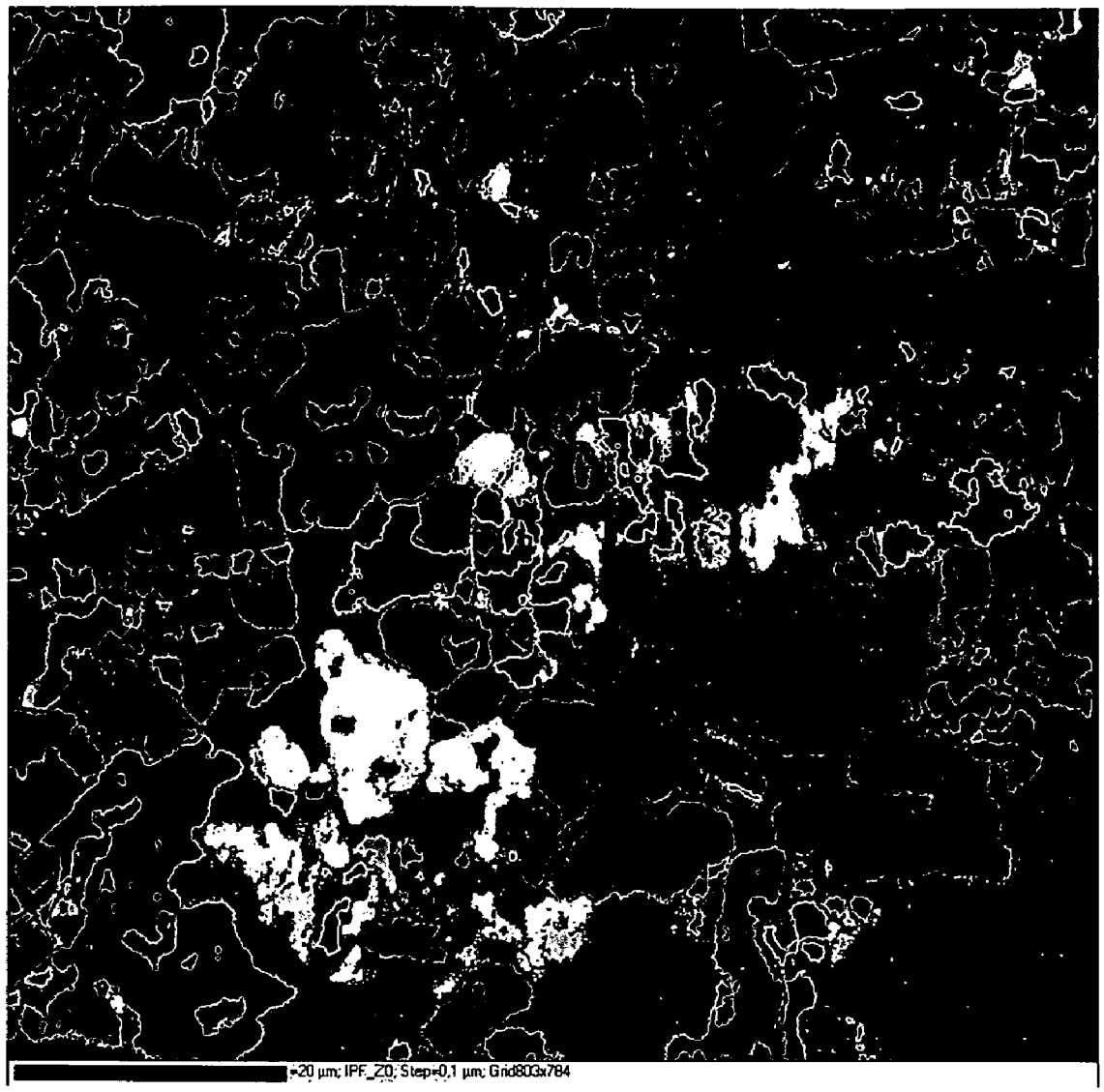
FIG. 24 shows an EBSD map of a sample, polished mullite with AIC seed layer.

Sample 4 is non-polished mullite/AIC (illustrated in FIG. 7) and sample 1 is polished mullite/AIC (illustrated in FIG. 8a and FIG. 24 (EBSD map)).

Sample 1 was superior to sample 4, indicating that better results are obtained when the AIC is applied onto a polished substrate compared to a non-polished substrate. Sample 4 (FIG. 7) was much more rough than sample 1 (FIG. 8a). It was possible to see the Si seeding 2a in sample 1 and the islands 3 have sharp contours. In contrast, the seeding layer 2a and the islands 3 cannot easily be identified in sample 4. From the EBSD map of sample 1 (FIG. 24), it was derived that the maximum diameter of the grains is about 17.9 microns. Doing the MIC process on a polished ceramic substrate 1a leads to larger grain sizes and less islands 3 than on a non-polished ceramic substrate.

Comparison—MIC on Non-Polished Substrates with and without Micro Flattening Layer, e.g. Spin-On Oxide Sample 4 is non-polished mullite/AIC (illustrated in FIG. 7) and sample 8 is non-polished mullite/spin-on oxide/AIC (illustrated in FIG. 9).

Sample 8 (FIG. 9) was superior to sample 4 (FIG. 7), indicating that better results are obtained when AIC is applied onto a non-polished substrate with a flattening layer than onto a non-polished substrate without flattening layer. Sample 4 (FIG. 7) was more rough than sample 8 (FIG. 9). It was possible to see the Si seeding layer 2a and islands 3 in sample 8. In contrast, the seeding layer 2a and the islands 3 cannot easily be identified in sample 4.

Figure 11B:
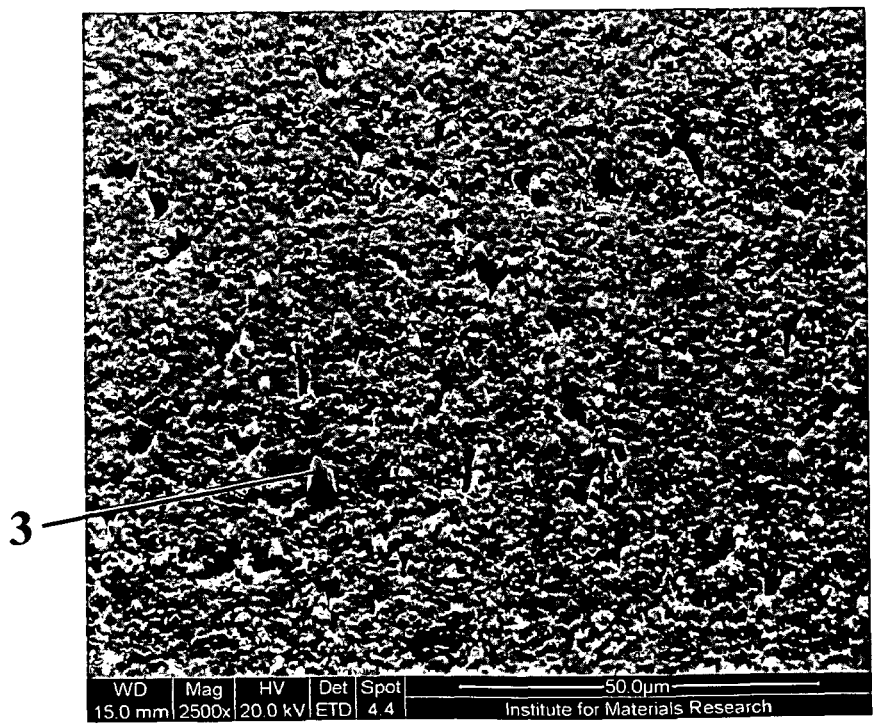
FIG. 11b is a SEM image of an alumina/spin-on oxide/AIC sample.
Figure 22:
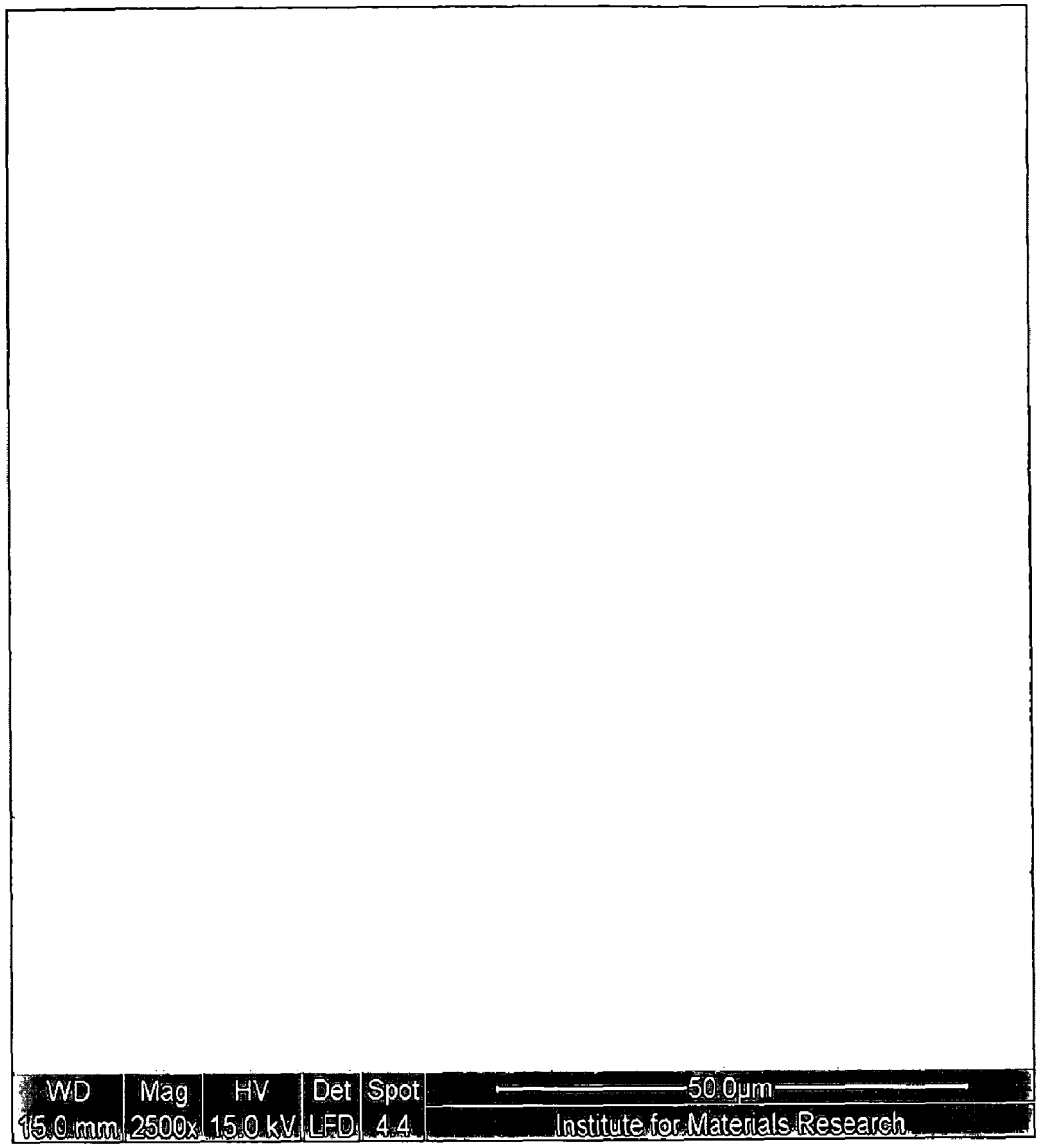
FIG. 22 is a SEM image of a sample alumina (without spin-on oxide) with AIC. An EBSD (Electron Back Scattering Diffraction) map was only possible on 0.3% of the total surface of this sample, resulting in a substantially uniform black picture, linked to the roughness of the sample.

FIGS. 1 and 22 depict the SEM of an alumina/AIC sample and FIGS. 3 and 11b depict the SEM of an alumina/spin-on oxide/AIC sample. The alumina/spin-on oxide/AIC sample was superior to the alumina/AIC sample, again indicating that it is better to apply AIC onto a non-polished substrate with a flattening layer than onto a non-polished substrate without flattening layer. The sample depicted in FIG. 1 was more microrough than the sample in FIG. 3. Furthermore, the sample in FIG. 1 had significantly more islands 3 than the sample in FIG. 3.

Therefore, using a micro flattening layer, e.g. spin-on oxide, leads to a substantial improvement of the MIC layer (larger grains, less islands) compared to the case without micro flattening layer.

Figure 25:
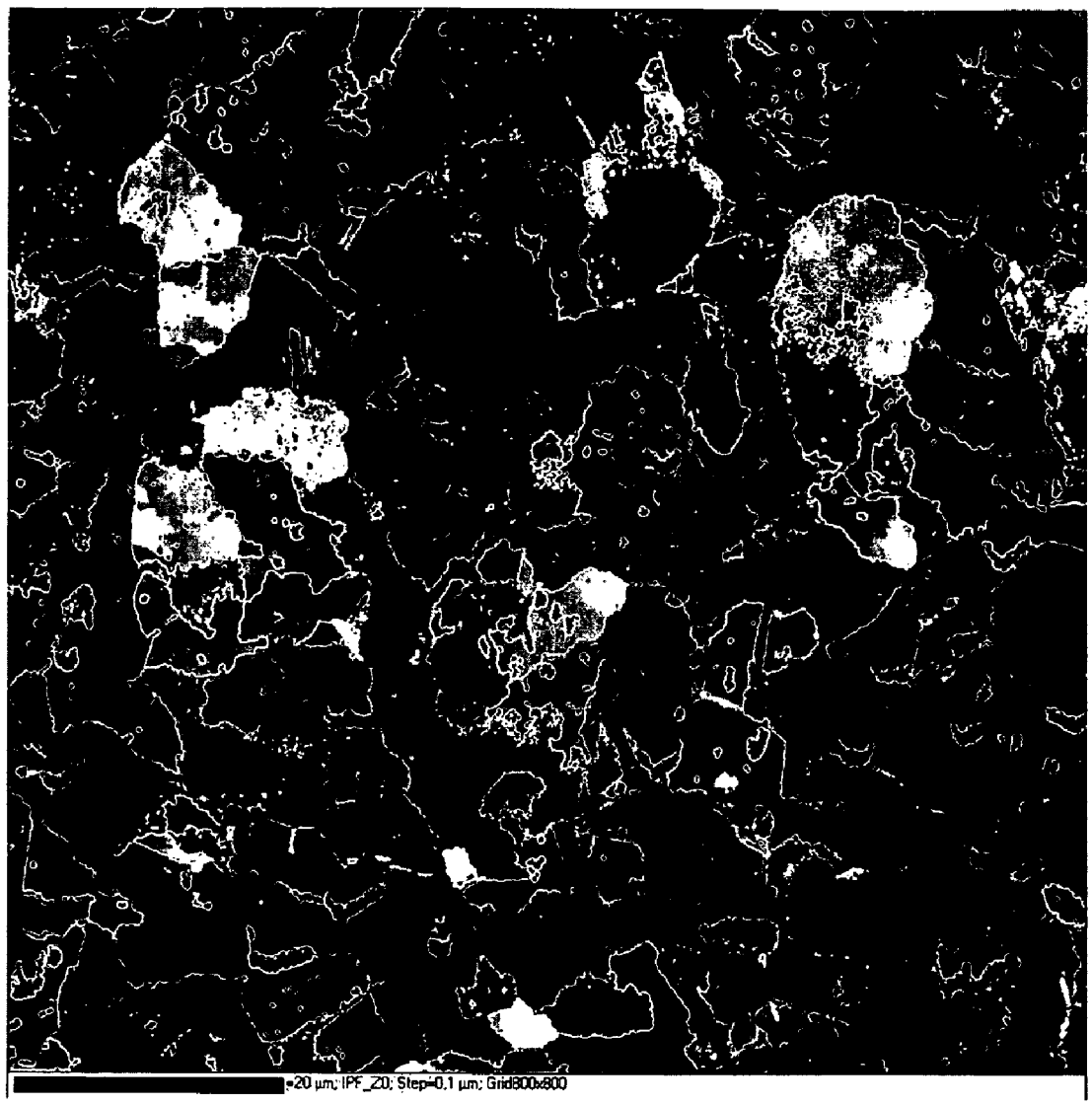
FIG. 25 shows an EBSD map of a sample of polished mullite with spin-on oxide and AIC seed layer.
Figure 26A:
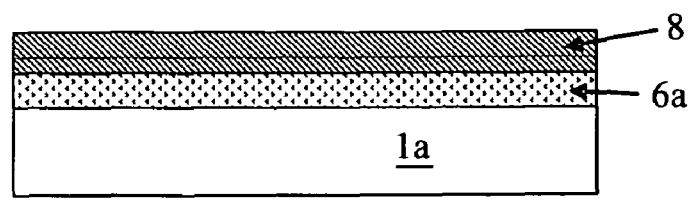
FIG. 26 is a schematic overview of a process according to a preferred embodiment.
Figure 26B:
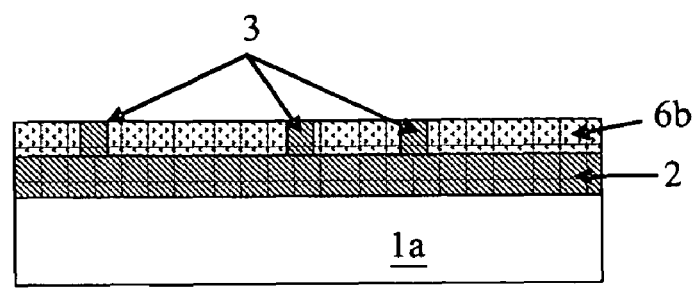
Figure 26C:
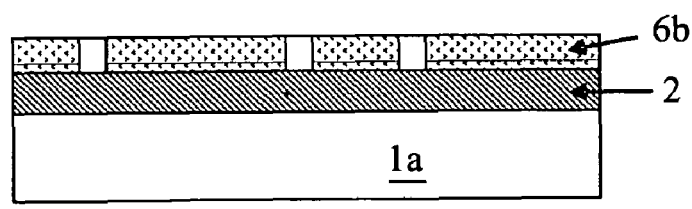
Figure 26D:
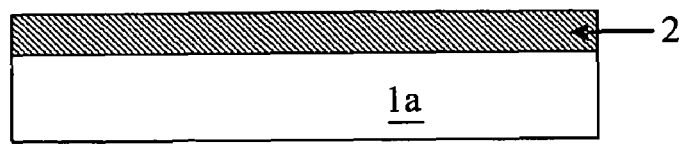

Comparison—MIC on Polished Substrates with and without Micro Flattening Layer e.g. Spin-On Oxide Sample 1 is polished mullite/AIC (illustrated in FIG. 8a and FIG. 24 (EBSD map)) and sample 5 is polished mullite/spin-on oxide/AIC (illustrated in FIG. 10a and FIG. 25 (EBSD map)).

Figure 8B:
FIG. 8b is a SEM image of sample 1.

From an electron backscattering diffraction (EBSD) map of sample 1 (FIG. 24), the maximum diameter of the grains were found to be 17.9 μm. FIG. 8b is a SEM image of the sample, where it was possible to see the holes in the Si seed layer and the islands 3 on top of the Si seed layer. Besides the holes in the seeding layer there were also holes in the substrate, as no flattening layer was applied to fill those holes.

Figure 10B:
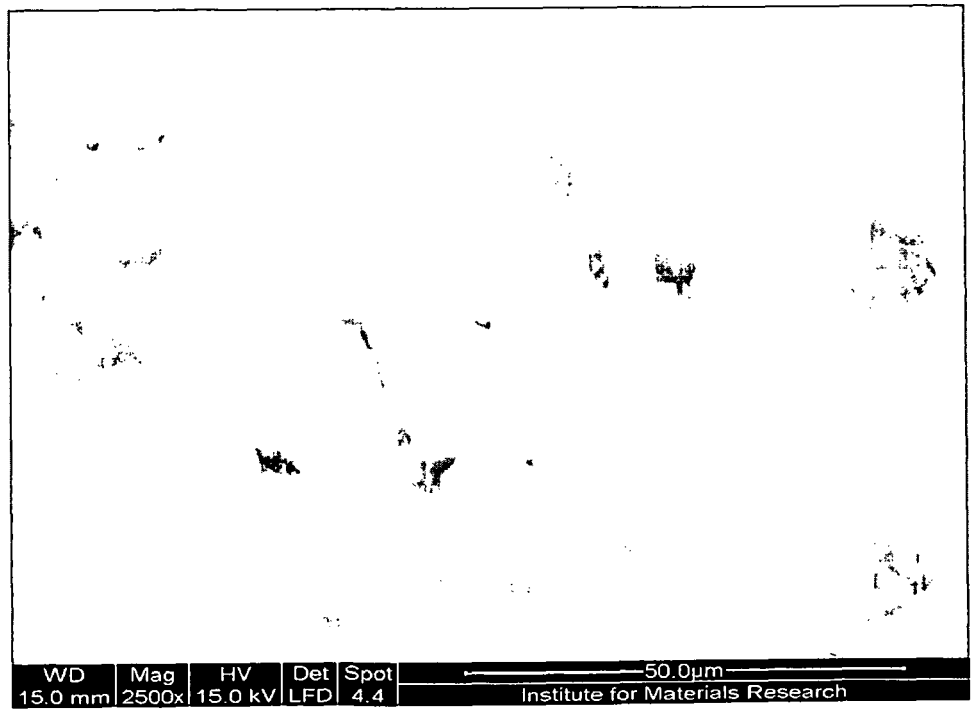
FIG. 10b is a SEM image of sample 5: polished mullite/spin-on oxide/AIC.

From an electron backscattering diffraction (EBSD) map of sample 5 (FIG. 25), the maximum diameter of the grains was found to be 17.1 μm. FIG. 10b is a SEM image of the sample. The density of holes and islands was decreased in comparison with sample 1. The big holes in the substrate were still present; the flattening layer used did not completely fill these holes.

When comparing both polished mullite samples, it can be seen that the use of a flattening layer decreased the density of islands (positive effect), the use of a flattening layer decreased the density of holes in the seeding layer (good effect), and there was not a big difference in grain size between both, using a flattening layer gives a slightly higher average grain size.

Without being bound by any particular theory, a possible explanation could be as follows: mullite is microflat and macroflat on some areas due to polishing. The flattening layer reduces the number of areas still having microroughness, which results in better seed layers, with less holes and islands.

Because polished mullite per se is already microflat and macroflat on many areas of the substrate, the influence of the flattening layer is less than with alumina (see below).

Sample 5 was superior to sample 1, indicating that a better result was obtained when applying AIC onto a polished substrate with micro flattening layer than to apply it onto a polished substrate without micro flattening layer. Sample 5 had fewer islands 3 and a smaller cover of islands than sample 1. Sample 5 also had less holes (is more continuous) than sample 1.

Using a micro flattening layer, e.g. spin-on oxide, led to a substantial improvement of the MIC layer (larger grains, less islands) compared to the case without a micro flattening layer, and this for both polished and unpolished substrates. There therefore appears to be a beneficial effect from using a micro flattening layer before applying MIC, e.g. AIC.

TEM pictures also demonstrated the increased grain size when using a flattening layer, e.g. spin-on oxide.

Figure 23:
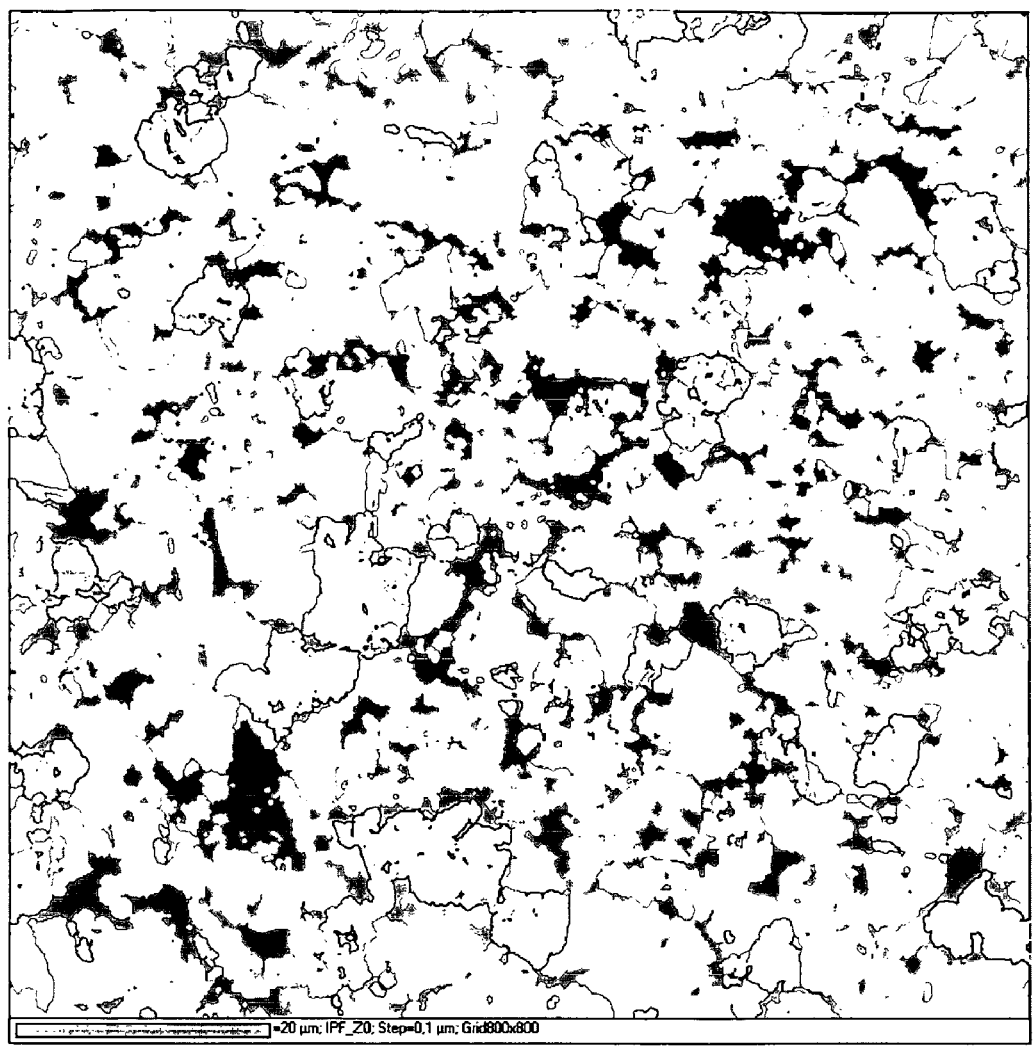
FIG. 23 shows an EBSD map of a sample alumina with spin-on oxide and AIC.

Comparison—MIC on Mullite and Alumina Substrates with Micro Flattening Layer e.g. Spin-On Oxide Sample 5 is polished mullite/spin-on oxide/AIC (illustrated in FIG. 10a and FIG. 10b (SEM)) and sample 9 is alumina/FOx/poly Si (illustrated in FIG. 11a, FIG. 11b (SEM), and FIG. 23 (EBSD))

From an electron backscattering diffraction (EBSD, see FIG. 23) map of sample 9, the maximum diameter of the grains was found to be 11.8 μm. Grains with a diameter larger than 5 μm covered 80% of the area. FIG. 11b is a SEM image of the sample, where it was possible to see the holes in the poly Si layer and the islands 3 on top of the poly Si layer.

An EBSD pattern is related to grain orientation. At places where holes and islands are located it is not always possible to determine the orientation due to partly shadowing of the EBSD patterns. For the above sample it was possible to determine the orientation on 86.1% of the surface. Corresponding EBSD measurement on alumina samples without FOx gave only orientation data on 0.3% of the surface, which shows that the surface, where there are a lot of islands, is too rough.

Comparing this result to the results for sample 5 already given above (maximum diameter of the grains 17.1 μm) shows bigger grain size between the open porosities on mullite sample than on alumina samples. Polished mullite are from the beginning less rough than alumina, which results in a bigger difference between samples with and without spin-on oxide for alumina than mullite. For both types of samples with spin-on oxide, mullite gave slightly better results than alumina.

The above description indicates that by providing a surface with reduced or substantially no microroughness, a much better MIC, e.g. AIC, seed layer can be obtained.

Example 6

Double Flattening (Both Micro and Macro Roughness)

Figure 16:
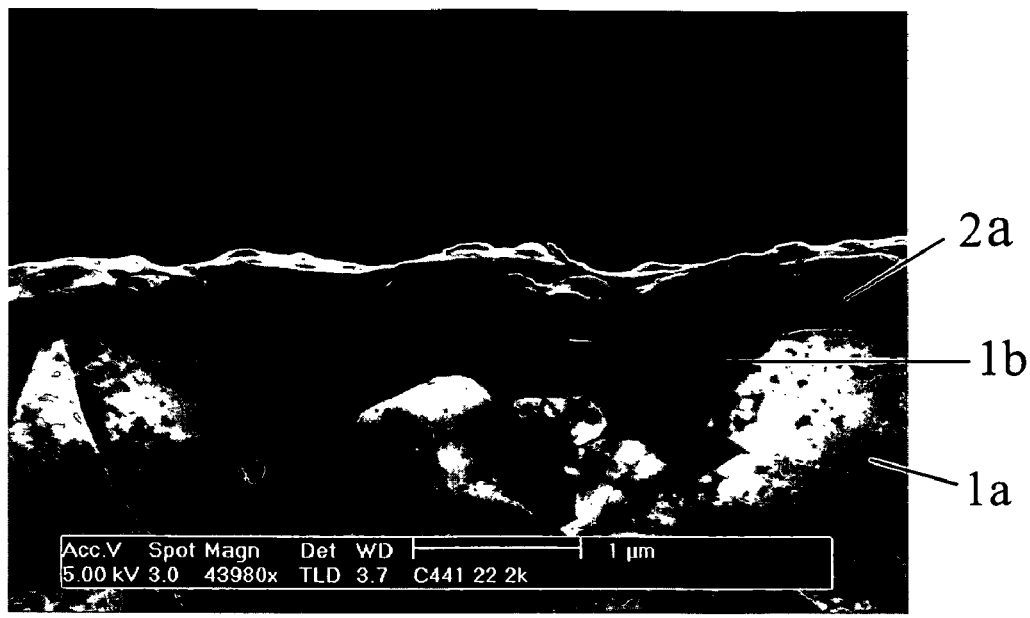
FIG. 16 is a cross-sectional view of a sample ceramic/spin-on oxide/AIC layer. The spin-on oxide layer was thinner compared to the other samples with a spin-on oxide layer (except for the one shown in FIG. 18, which is from the same sample).
Figure 17:
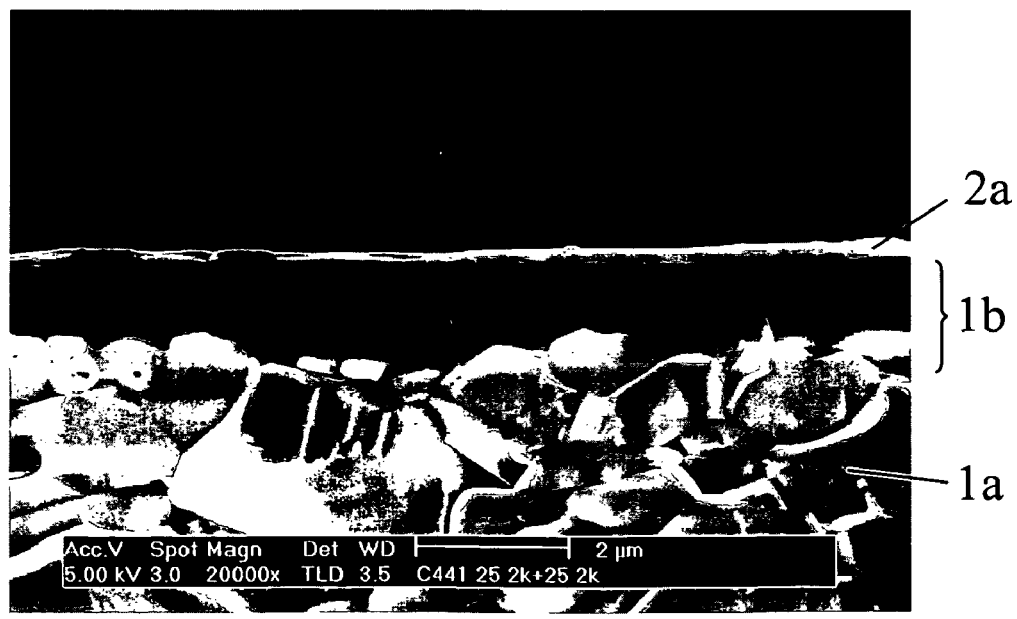
FIG. 17 is a cross-sectional view of a sample ceramic/spin-on oxide/AIC layer with double spin-on oxide layer.

It was found that by also removing the macroroughness the MIC, e.g. AIC, process is further improved, though the improvement is less than when going from a microrough to a microflat surface. Obtaining a macroflat surface can for instance be achieved by twice spinning a flowable oxide over a surface. This result can be seen from FIG. 16 compared to FIG. 17, the first one showing a cross-section of a sample ceramic 1a/spin-on oxide 1b/AIC layer 2a, and the second one showing a cross-section of a sample ceramic 1a/spin-on oxide 1b/AIC layer 2a, with double spin-on oxide layer. In the case of FIG. 17, the spin-on oxide layer 1b/AIC layer 2a interface is both micro- and macroflat.

Figure 18:
FIG. 18 is a top view optical microscope picture of a sample ceramic/spin-on oxide/AIC layer after aluminum removal (127×95.5 μm$^2$). The spin-on oxide layer was thinner compared to the other samples with a spin-on oxide layer (except for the one shown in FIG. 16, which is from the same sample).
Figure 20:
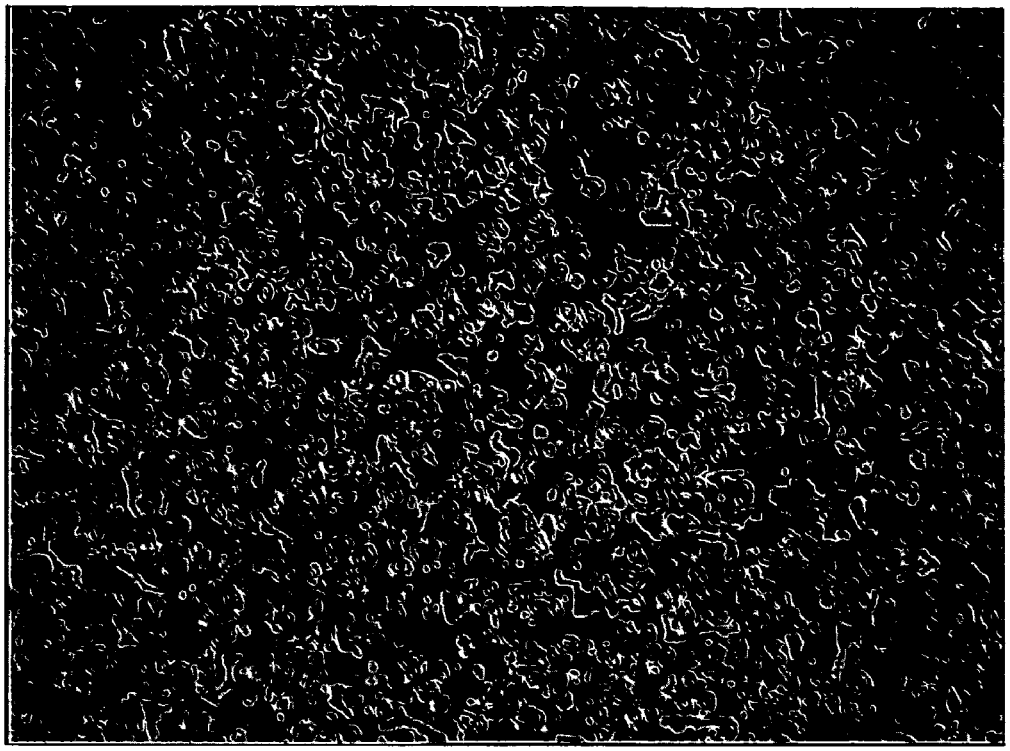
FIG. 20 is a top view optical microscope picture of a sample ceramic/spin-on oxide/AIC layer with double spin-on oxide layer after Aluminum removal (127×95.5 μm$^2$).

FIG. 18 and FIG. 20 show top view optical microscope pictures of sample ceramic 1a/spin-on oxide 1b/AIC layer 2a after aluminum removal. In the case of FIG. 18, the spin-on oxide layer 1b consists of a single layer. In the case of FIG. 20, the spin-on oxide layer 1b consists of a double spin-on oxide layer. It can be seen that in the double spin-on oxide layer, a flatter seed layer is obtained than in the single spin-on oxide layer. The AIC layer in FIG. 18 has a decreased quality compared with FIG. 11a (both alumina/spin-on oxide/AIC), because the spin-on oxide layer was thinner (more macroroughness).

Figure 19:
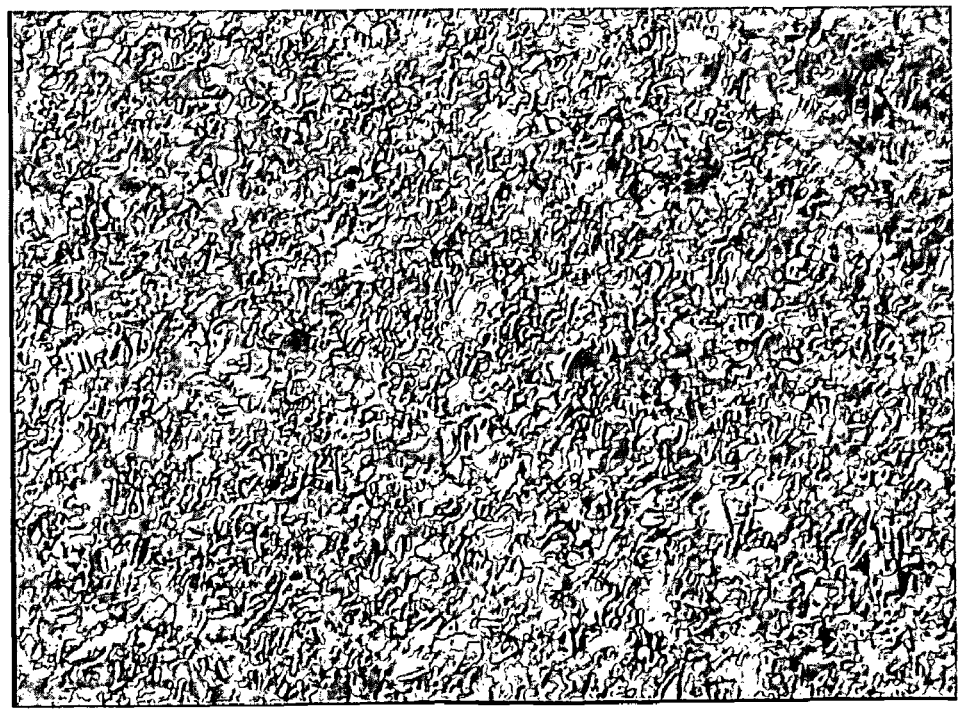
FIG. 19 is a top view optical microscope picture of a sample ceramic/spin-on oxide/AIC layer after epitaxial growth (127×95.5 μm$^2$).
Figure 21:
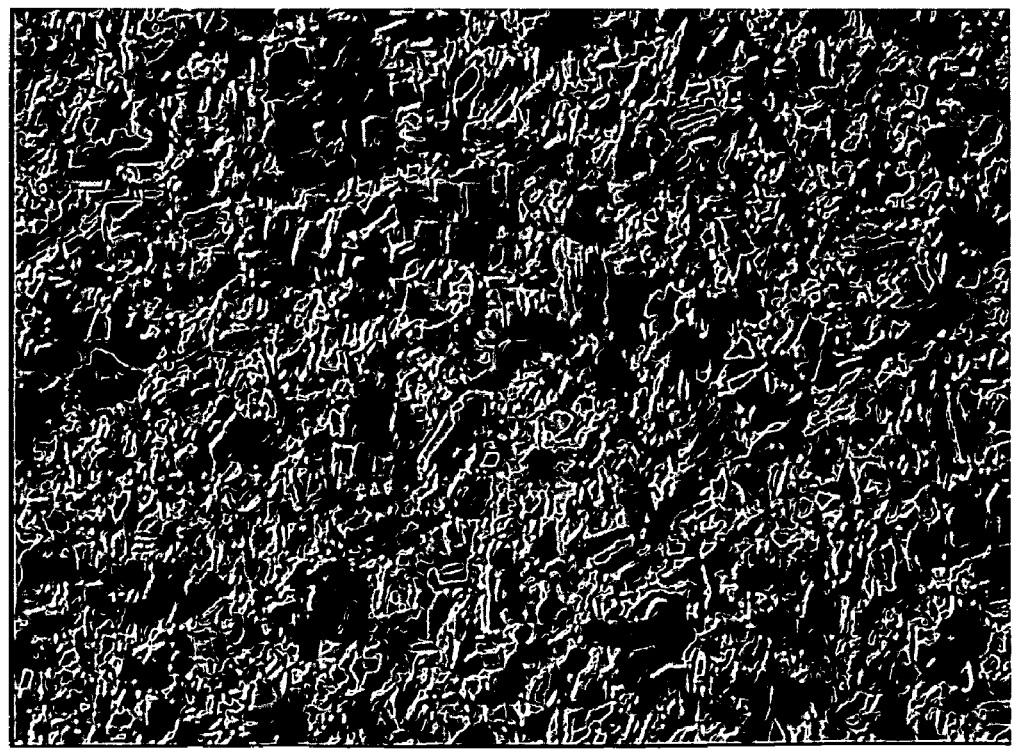
FIG. 21 is a top view optical microscope picture of a sample ceramic/spin-on oxide/AIC layer with double spin-on oxide layer after epitaxial growth (127×95.5 μm$^2$).

FIG. 19 and FIG. 21 show top view optical microscope pictures of a sample ceramic 1a/spin-on oxide 1b/AIC layer 2a after epitaxial growth. In FIG. 19, the FOx layer 1b consists of a single layer. In FIG. 21, the spin-on oxide layer 1b consists of a double spin-on oxide layer. It can be seen that in case of the double FOx layer, bigger structures are obtained than in the case of a single spin-on oxide layer, which is an indication of bigger grains, and thus better epitaxial quality.

These results illustrate that macroflattening has an advantageous effect on grain sizes obtained by epitaxial growth onto an MIC seed layer (e.g., larger grain sizes are obtained).

It was found that solar cells with an absorber layer made from polycrystalline silicon with very small grains of 0.2 µm had almost the same open-circuit values (Voc) as solar cells with an absorber layer made from polycrystalline silicon grown on an AIC seed layer with grain diameters of up to 50 µm. Since the Voc of thin-film solar cells is a measure for the electronic quality of the absorber layer, the quasi-independence of the open-circuit voltage on the grain size indicates that grain boundaries and grain size distribution are not the only factors limiting the electronic quality of polycrystalline silicon layers. To visualize defects other than grain boundaries, adapted Schimmel (1 (HF 49%): 1 (CrO3 0.7M)) etching was done on an epitaxial layer grown on top of an AIC seed layer. After such etching, intragrain defects may be distinguished from grain boundaries. Besides epitaxial stacking faults other defects like e.g. dislocation lines crossing the surface were found. Room-temperature EBIC measurements were performed to characterize local electrical defects. The same pattern as after defect etching was present, indicating that the defects have a strong recombination activity. It was found that most defects were formed in the seed layer or at the seed layer-epitaxial layer interface.

Figure 29:
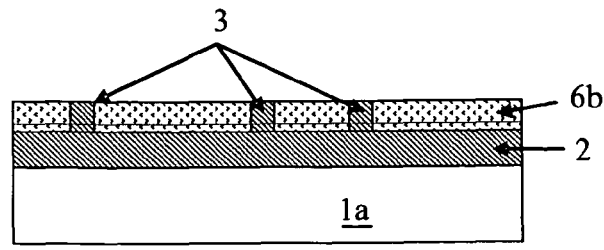
FIG. 29 is a schematic representation of an AIC layer after crystallization. On top of the polycrystalline silicon basic seed layer silicon islands are present. These islands or enclosures are surrounded or enclosed by Al. Besides silicon islands, other secondary crystallite may be present (not shown).
Figure 30:
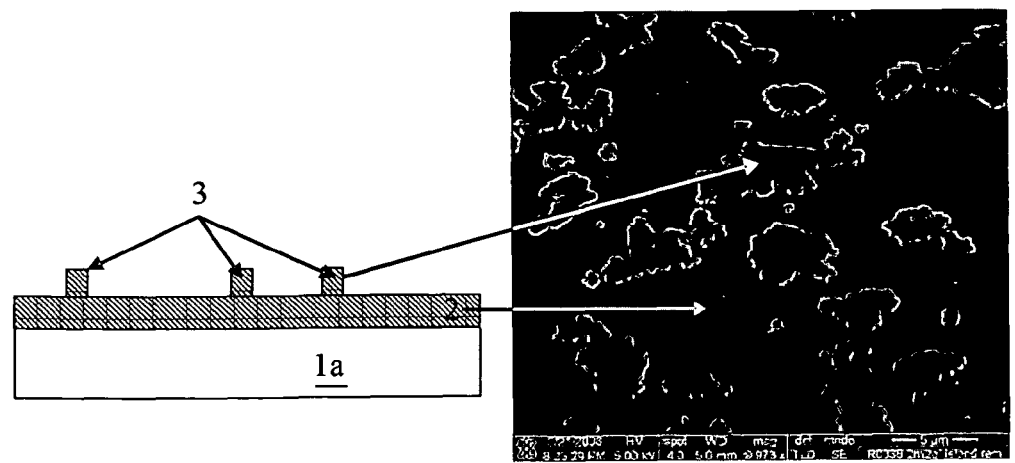
FIG. 30 is a schematic representation of an AIC layer after crystallization and Al removal and a SEM image of such a layer.

Well shaped Si islands 3 have been found after aluminum induced crystallization, especially after performing a microflattening step as described above and as e.g. illustrated in FIG. 3. A lot of these islands 3 were visible after crystallization, the islands 3 having the same height as the Al layer 6b (schematic representation in FIG. 29). A SEM image of a seed layer 2a after Al removal is shown in FIG. 30. In this Figure the well shaped islands 3 are clearly visible. One aspect includes selectively etching the islands 3 before removing the aluminum 6b.

Figure 27A:
FIG. 27 is a cross section EBSD IPF (Inverse Pole Figure) map of a seed layer that has been epitaxially thickened at a temperature of 1000° C.
Figure 27B:
Figure 27C:
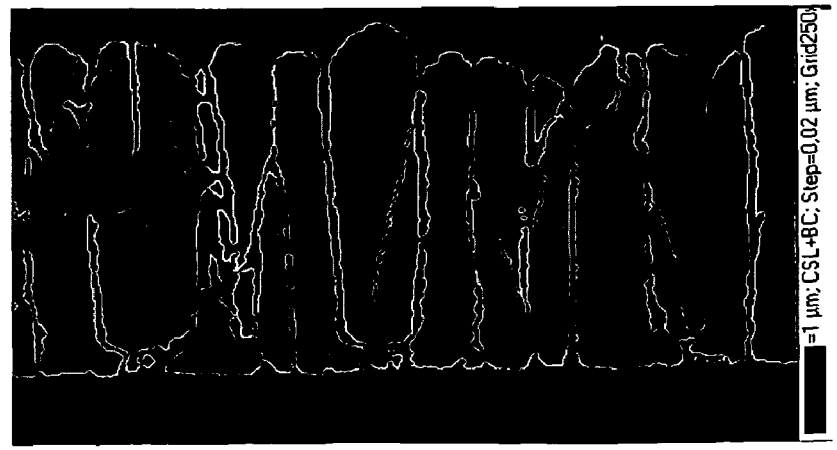
Figure 28A:
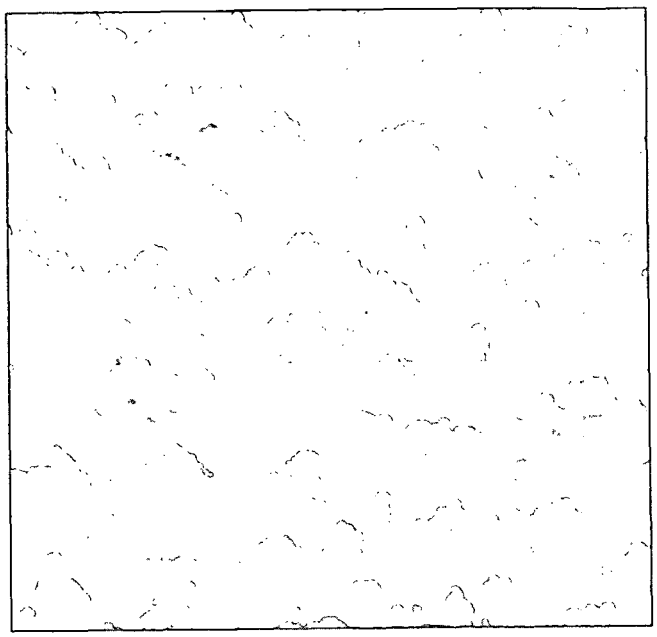
FIG. 28a is a top view SEM of an AIC seed layer with crystalline Si islands.
Figure 28B:
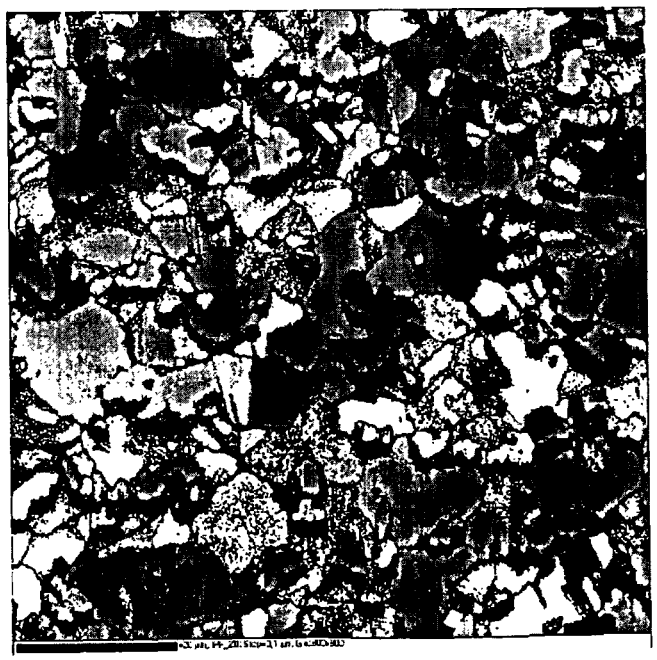
FIG. 28b is an EBSD IPF image of the same region.

Silicon islands 3 and/or secondary crystallites 5 present on the surface of AIC seed layers 2a may have a negative effect on the quality of an epitaxial layer 2b grown on top of the seed layer. Due to their different orientation compared to the seed layer 2a they can give rise to grain boundaries and stress in the epitaxial layer 2b, e.g. solar cell absorber layer. The differences in orientation can e.g. be observed by comparing a SEM image with an EBSD measurement of the same area, as is illustrated in FIGS. 28a and 28b. This is also clear from FIG. 27, which shows a cross section EBSD IPF map of a seed layer 2a with an epitaxial layer 2b grown on top of it at a temperature of 1000° C. Furthermore, due to the presence of silicon islands 3 and/or secondary crystallites 5 the starting surface for epitaxial growth is rough. The removal of islands could therefore lead to an increased epitaxial layer quality and solar cell performance.

It was found that, after aluminum induced crystallization, the silicon islands 3 and the aluminum layer 6b are covered with a thin layer 7 comprising substantially or only aluminum oxide. On the aluminum the aluminum oxide may be a native oxide. In preferred embodiments this thin layer 7 can be removed by a thin layer removal process, which is adapted for removing a thin layer of aluminum oxide without removing any part of the aluminum layer 6b, or without removing the aluminum layer 6b partially or completely. This thin layer removal process is preferably not removing any part of the silicon islands 3. In certain embodiments it may remove the silicon islands 3 only partially. In certain embodiments it may remove the silicon islands 3 completely.

After removing the thin layer 7 of aluminum oxide from the silicon islands 3, the aluminum layer 6b or the remainder of the aluminum layer can be used as a mask for selective island removal. The island removal procedure according to preferred embodiments is less sensitive to the AIC layer formation and therefore more generally applicable than prior art solutions.

The island removal procedure according to preferred embodiments is illustrated in FIG. 26. On a face of a substrate 1a a crystalline silicon layer is formed according to preferred embodiments, wherein preferably the amount of microroughness of the substrate 1a may be reduced before starting an AIC process. An AIC process is then performed, comprising: aluminum layer 6a deposition on the face of the substrate 1a, aluminum layer oxidation, amorphous silicon layer 8 deposition and annealing. After annealing the structure shown in FIG. 26b is obtained, comprising on the substrate 1a a silicon seed layer and an Al layer 6b. The silicon seed layer 2a may comprise a basic silicon seed layer 2 and silicon islands 3. Before removing the aluminum layer 6b, the thin layer 7 may first be removed and then the silicon islands 3 are selectively removed, e.g. etched, thereby using the aluminum layer 6b as an etching mask. This is illustrated in FIG. 26c. After selectively removing the silicon islands 3, the remaining aluminum layer 6b may be removed and the structure shown in FIG. 26d may be obtained. This structure comprises a basic silicon seed layer 2 (without silicon islands 3) on a face of the substrate 1a.

In preferred embodiments, the process to selectively remove islands 3 from silicon seed layers 2a made by AIC can be performed by:

removing, e.g. etching, Al and Si at the same speed, by means of a dry etching technique, e.g. plasma etching; or removing, e.g. etching, Si faster than Al, with a dry etching technique, e.g. plasma etching; or removing, e.g. etching, Al and Si at the same speed, with a wet etching technique; or removing, e.g. etching Si faster than Al, with a wet etching technique.

Other removal techniques which fulfill these conditions and which are known in the art, such as e.g. sputtering, can also be used.

In the embodiments with a higher etching speed for Si than for Al, after removal of the silicon islands, a further step can be performed to remove the remaining aluminum mask.

In preferred embodiments, the thin layer 7 removal process and the process to selectively remove silicon islands 3 from silicon seed layers made by AIC may be one and the same process. In such embodiments, the process to selectively remove islands 3 from silicon seed layers 2a made by AIC can be performed by:

- removing, e.g. etching the stacks comprising a silicon island 3 and a thin layer 7 of aluminum oxide faster than the stacks comprising aluminum 6b and a (native) aluminum oxide, or at the same speed, with a dry etching technique, e.g. plasma etching; or
- removing, e.g. etching the stacks comprising a silicon island 3 and a thin layer 7 of aluminum oxide faster than the stacks comprising aluminum 6b and a (native) aluminum oxide, or at the same speed, with a wet etching technique.

Other removal techniques which fulfill these conditions and which are known in the art, such as e.g. sputtering, can also be used.

Selective etching of silicon with respect to aluminum is known and can for example be done by plasma etching or wet etching (e.g. TMAH). By controlling the etching time in preferred embodiments it is possible to selectively remove the silicon islands 3 without etching the basic seed layer 2. The thin oxide present between the islands and the basic seed layer may be used as a etch stop layer.

Figure 31:
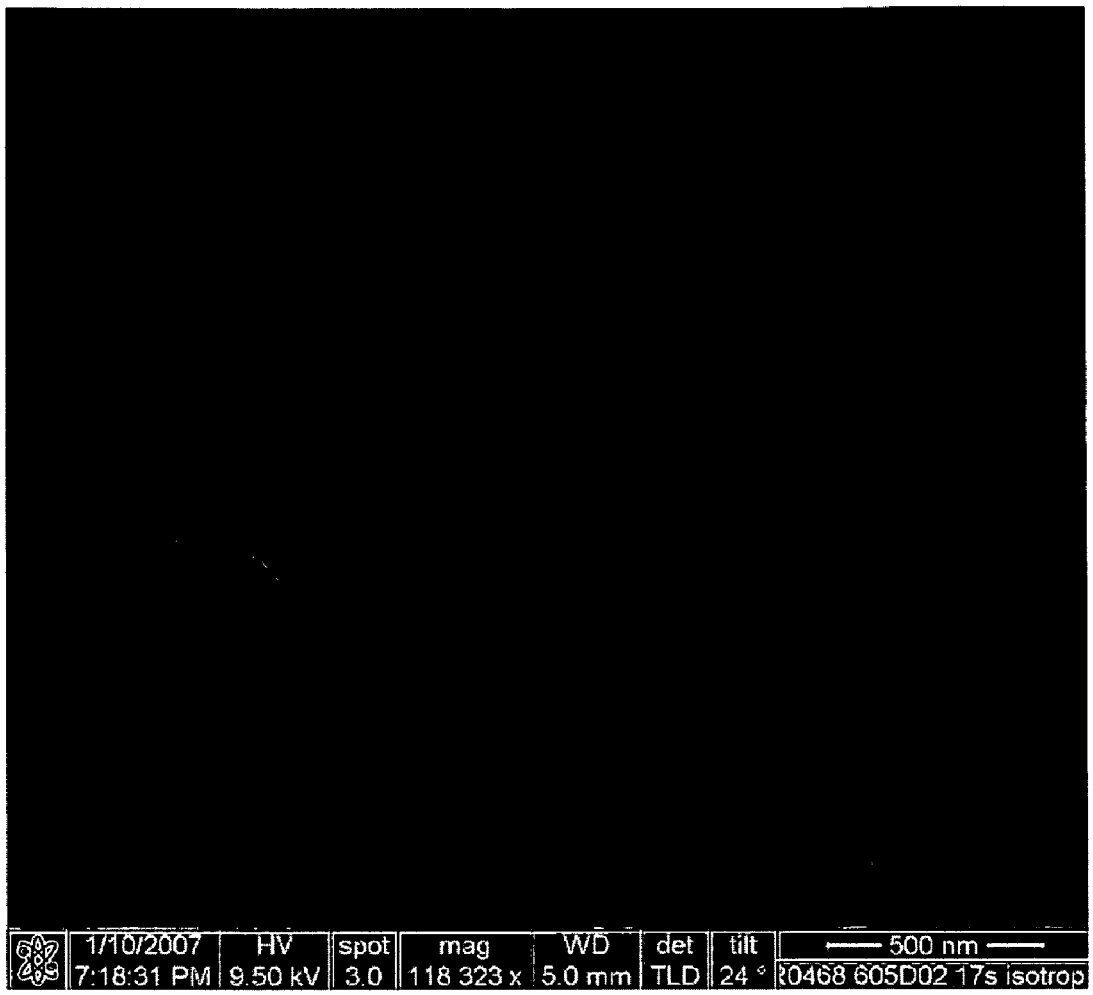
FIG. 31 is a SEM image of the following layer: AlC process+direct selective etching of the islands without any pre-treatment (no aluminum oxide removal first)+Al removal.

Etching directly after aluminum induced crystallization, with an etchant that is selective for Si compared to Al, may result in inhomogeneous etching of the islands 3, as illustrated in FIG. 31 (compare with FIG. 30). This may be due to the presence of a thin layer 7 on the silicon islands 3. It was found that this layer 7 can be removed by an HF (2%) dip followed by a $H_3PO_4$ etching step. When this pre-treatment was done the selective etching of the islands 3 was much more uniform.

Figure 33:
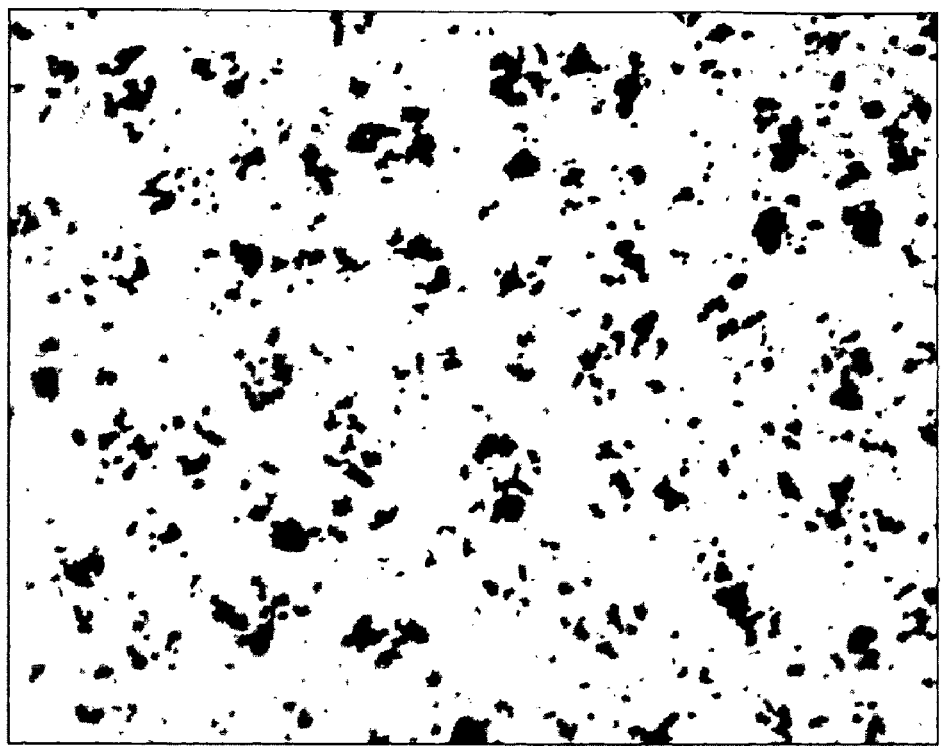
FIG. 33 is an optical image of a sample used for Auger Electron Spectroscopy of silicon islands and Al layers

Auger Electron Spectroscopy (AES) measurements were performed to analyze the nature of this thin layer 7. A standard AIC seed layer 2a was made. The aluminum layer 6b was not removed. FIG. 33 is an optical microscope image (width of the image ~10 μm) after crystallization of the surface of the sample used for Auger measurements. The dark areas are silicon islands 3, the light area surrounding the silicon islands is the aluminum matrix 6b.

Figure 34A:
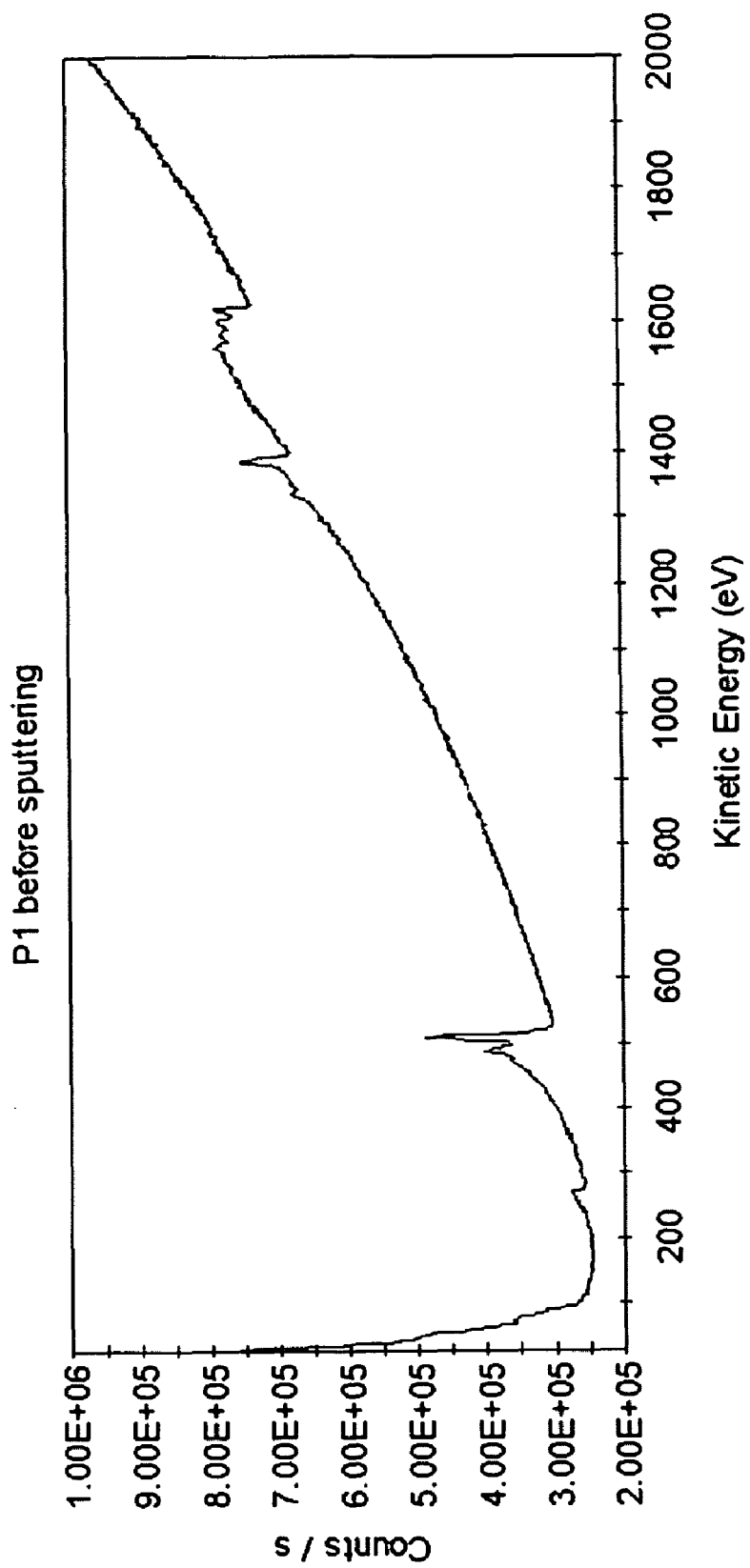
FIG. 34a shows survey spectra recorded on a silicon island before ion sputtering.
Figure 34B:
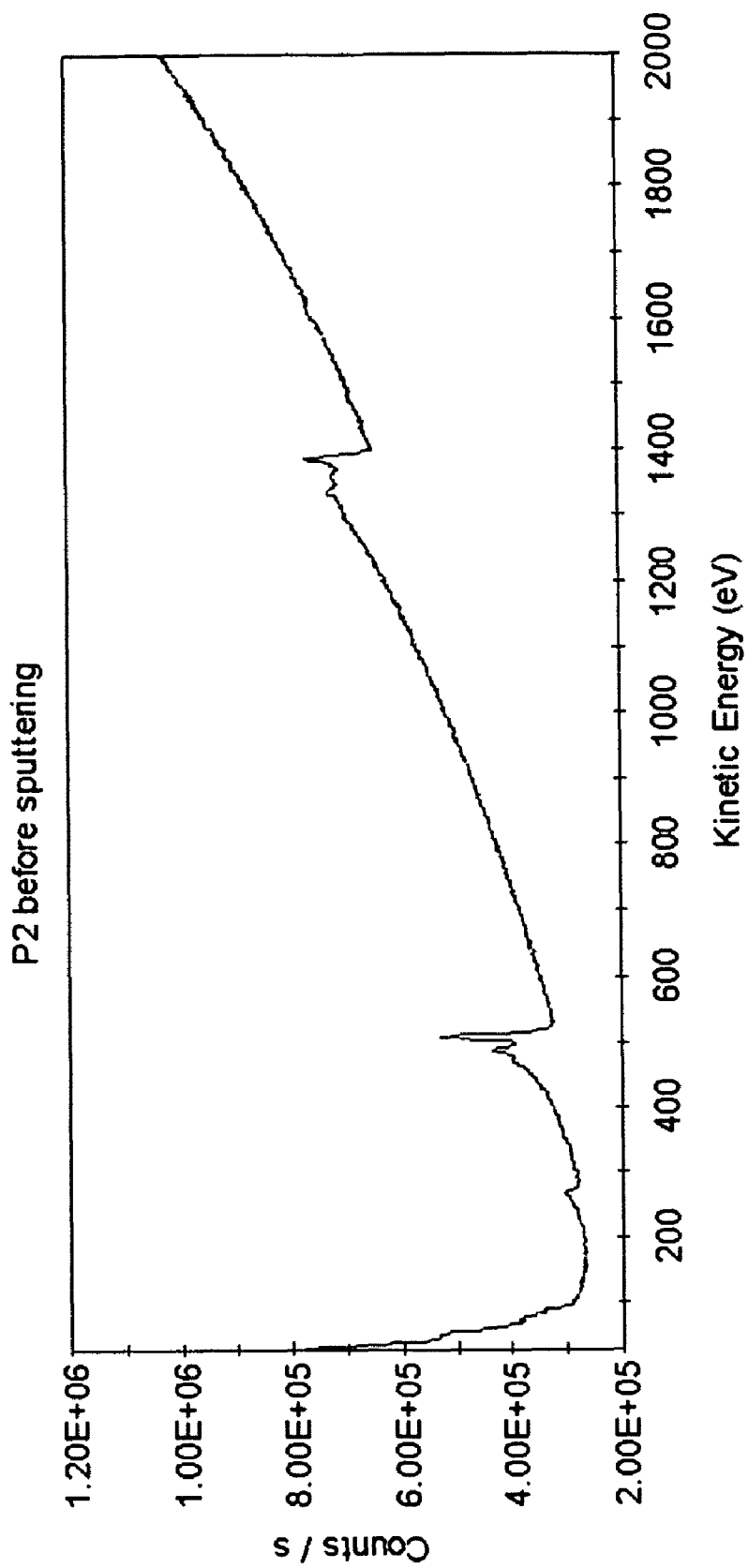
FIG. 34b shows survey spectra recorded on the Al surface before ion sputtering.

Auger Electron Spectroscopy (AES) surface scans were done on the silicon islands 3 (FIG. 34a) as well as on the aluminum layer 6b (FIG. 34b) to analyze the composition. The measurements were done on points, meaning that only a few nm in lateral dimension have been analyzed. Therefore a distinction between the silicon islands 3 and the aluminum matrix 6b can be made. The volume from which the AES electrons are ejected is only a few nm. The spectrum acquired on a silicon island 3 reveals the presence of C, O and Si together with a high peak of aluminum oxide (AlOx) (C and O are contaminants that may result from exposure of the sample to air). It can be seen that AlOx, C and O are detected at the surface of the aluminum matrix 6b. This measurement indicates that the thin layer 7 on top of the silicon islands 3 is an aluminum oxide layer.

Figure 35:
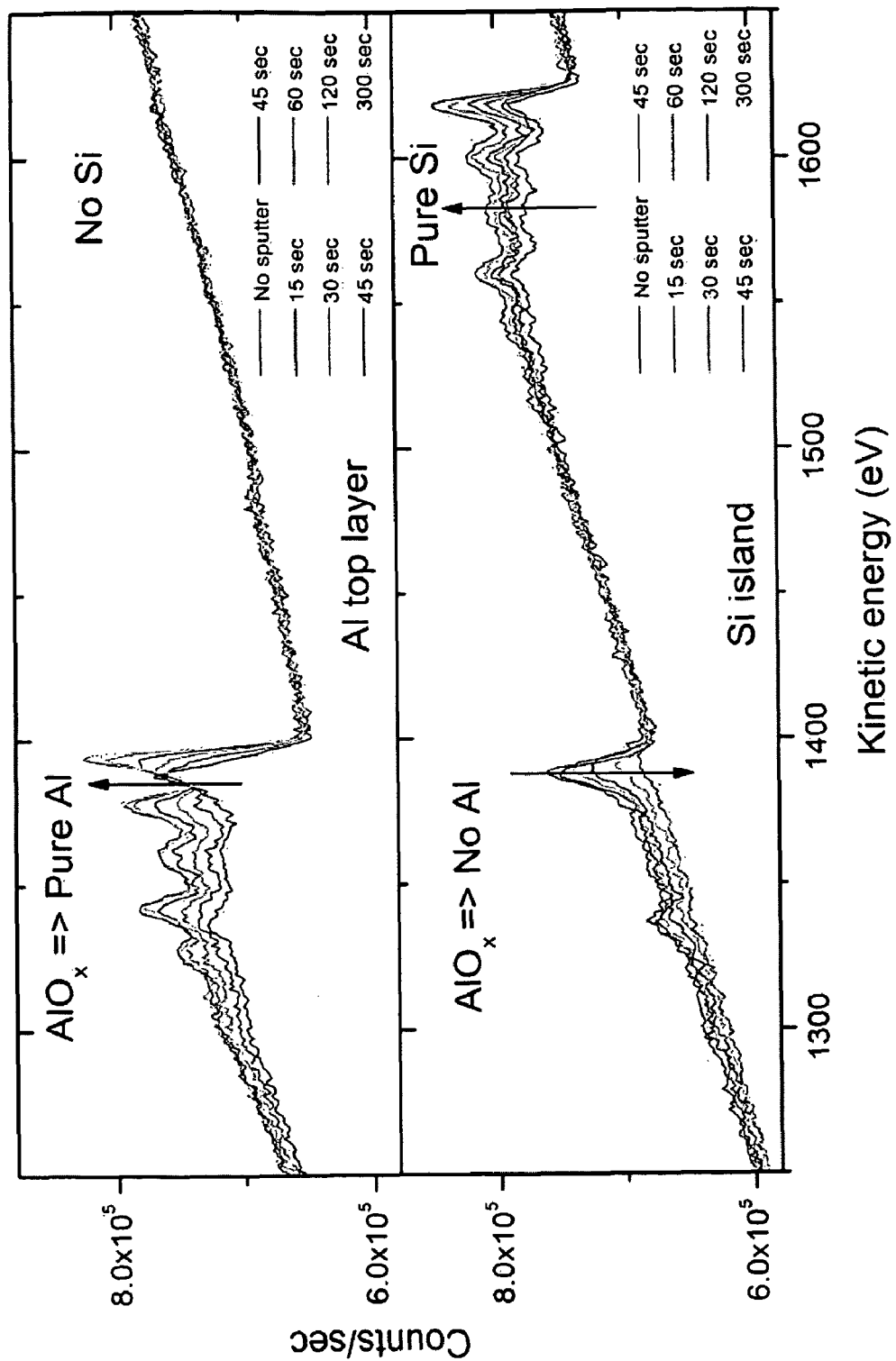
FIG. 35 shows surveys acquired on the Al matrix (top) and silicon island (bottom) after different sputtering times.

Further, measurements have been performed in combination with gradual removal of the layer by sputtering (FIGS. 35a and 35b). The Auger measurement values were recorded on both silicon islands 3 (FIG. 35a) and aluminum 6b (FIG. 35b) after different sputtering times to analyze the layer composition in depth. The sputtering is performed over an area of about 1×1 $mm^2$. SEM images between successive sputtering steps have been recorded to ensure that the same place is analyzed (no drift). The volume from which the Auger electrons come from is not changed by the sputtering. For the aluminum matrix 6b, it can clearly be seen that the C and O and AlOx contaminants decrease as a function of sputtering time and that only pure aluminum is detected at the end. For the silicon island 3 a continuous decrease of the AlOx signal with sputtering is noted. After 5 min of sputtering, only silicon is still detected. The same results have been obtained at other locations (silicon islands and aluminum matrix). From the AES analyses, aluminum oxide was identified on top of the Si islands 3 (the thin layer 7 comprising mainly aluminum oxide, but with minor amounts of C and O due to contamination) and therefore it can be concluded that the layer 7 on top of the Si islands 3 is aluminum oxide.

A result for selective etching of the islands 3 according to the preferred embodiments without any optimization of the etching time (resulting in some etching of the basic seed layer 2 under the islands 3) is shown in FIG. 32. It shows that islands 3 could be selectively removed without thinning the basic seed layer 2 too much. The etching in the basic seed layer seems to be rougher than the etching of the islands. The oxide layer between the island and the basic seed layer may act as an etch stop layer.

The following selective etching solutions/systems have been used for selectively etching the silicon islands 3 with respect to the aluminum layer 6b:

- deep dry etching with an ICP-ASE system (Induced Coupled Plasma), using $SF_6$ gas; and
- 3-chamber Reactive Ion Etching (RIE), using $SF_6$ gas.

The same method (using Al as an etching mask) can also be carried out by wet etching. A possible wet etching solution is TMAH.

Figure 36:
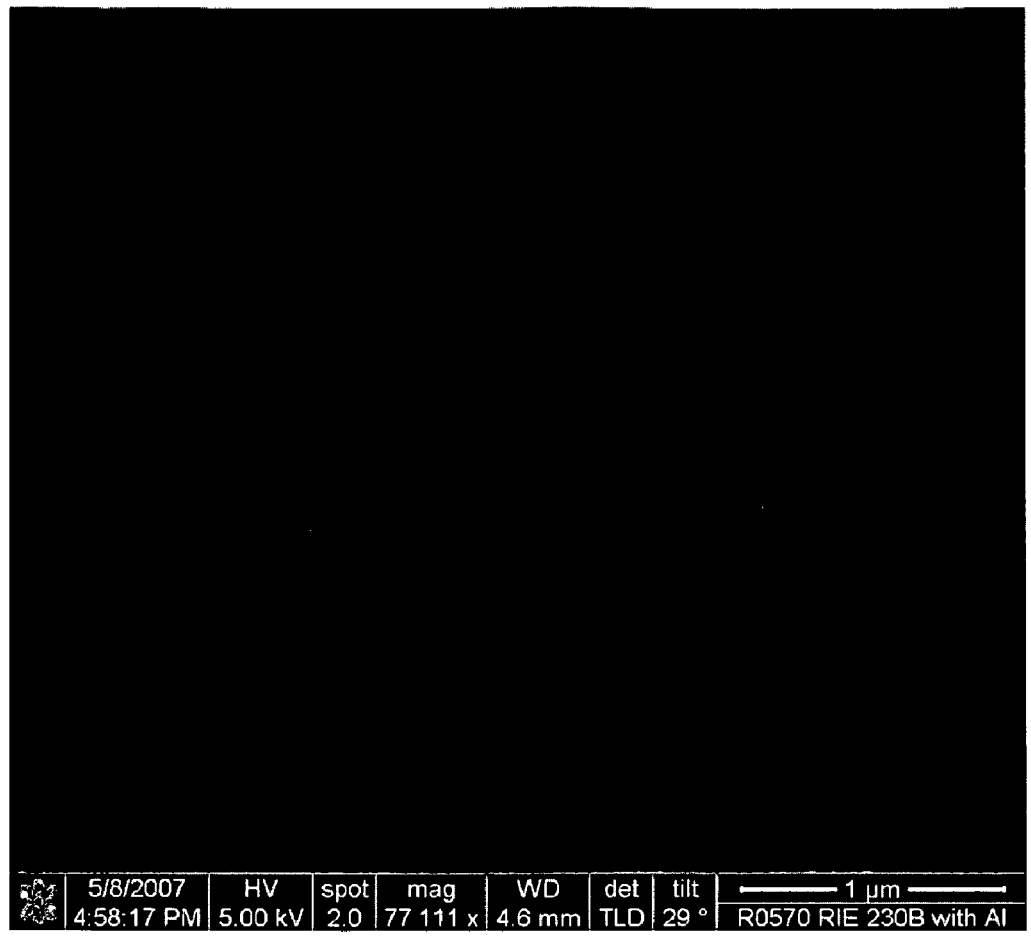
FIG. 36 shows the surface of the aluminum mask and the silicon islands (e.g. in the centre of the picture), after having removed a thin layer of Aluminum oxide with an HF dip and a short $H_3PO_4$ etch. It can be seen that also a thin layer of the aluminum mask has been removed.

Etching agents that can be used for the removal of the aluminum oxide layer 7, are for instance etching agents comprising or consisting of HF and/or $H_3PO_4$. The result of such a removal is depicted in FIG. 36, showing the surface of the aluminum mask 6b and silicon islands 3 (a silicon island is located in the central part of FIG. 36), after having removed a thin layer 7 of aluminum oxide with an HF dip followed by a short $H_3PO_4$ etch.

Figure 37A:
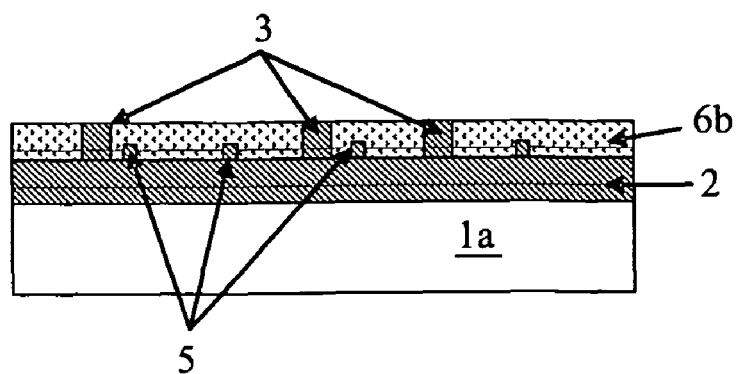
FIG. 37 illustrates the presence of secondary crystallites within the aluminum mask and additional silicon etching according to a preferred embodiment.
Figure 37B:
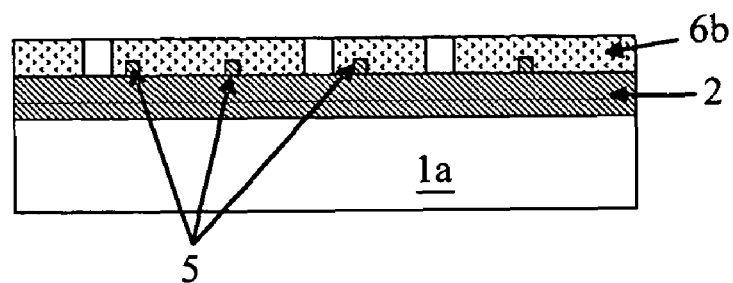
Figure 37C:
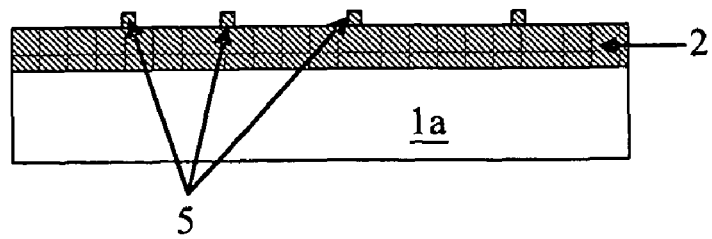

Apart from silicon islands 3, secondary crystallites 5 may also have been formed within the aluminum layer 6b (mask layer), as illustrated in FIG. 37. As opposed to silicon islands 3, secondary crystallites 5 do not reach through the front surface of the aluminum layer 6b. In embodiments with a different removal speed between silicon and aluminum, this means that after having removed the silicon islands 3 and after having removed the remainder of the aluminum mask 6b, these secondary crystallites 5 may still be present at the surface of the seed layer 2a, as illustrated in FIG. 37c. Therefore, an additional silicon etch may be performed to remove these secondary crystallites 5 and thereby improve the overall surface quality of the seed layer, and consequently of the epitaxial layer grown on top of the seed layer afterwards.

Silicon islands 3 and/or secondary crystallites 5 remaining on the seed layer after crystallization may jeopardize the quality of an epitaxial layer 2b grown on the seed layer 2a. The islands 3 and/or secondary crystallites 5 may introduce defects in the epitaxial layer 2b because due to their presence the starting surface for epitaxial growth can be rough. The influence of the silicon islands 3 on the quality of the epitaxial layer 2b can be drastically reduced by using the selective island removal process according to preferred embodiments.

Another reason for the negative influence of secondary crystallites 5 and islands 3 on the quality of an epitaxial layer 2b grown on top of a seed layer 2a may be their different orientation as compared to the basic seed layer 2. This is illustrated in FIG. 27, showing a cross section EBSD map of an epitaxial layer on top of a seed layer, and in FIG. 28, showing a top view SEM image of a seed layer with silicon islands (left) and an EBSD image of the same region (right).

In these Figures it can be seen that the crystal orientation of the islands 3 in most cases differ from the orientation of the surrounding grains. In FIG. 27 it can be seen that due to their different orientation the silicon islands 3 introduce additional grain boundaries in the epitaxial layer 2b (compared to the number of grain boundaries in the basic seed layer 2), leading to grains with relatively small grain sizes in the epitaxial layer 2b (compared to the grain size distribution in the basic seed layer 2). The epitaxial growth in FIG. 27 was done in a LPCVD system at 1000° C.

Figure 38:
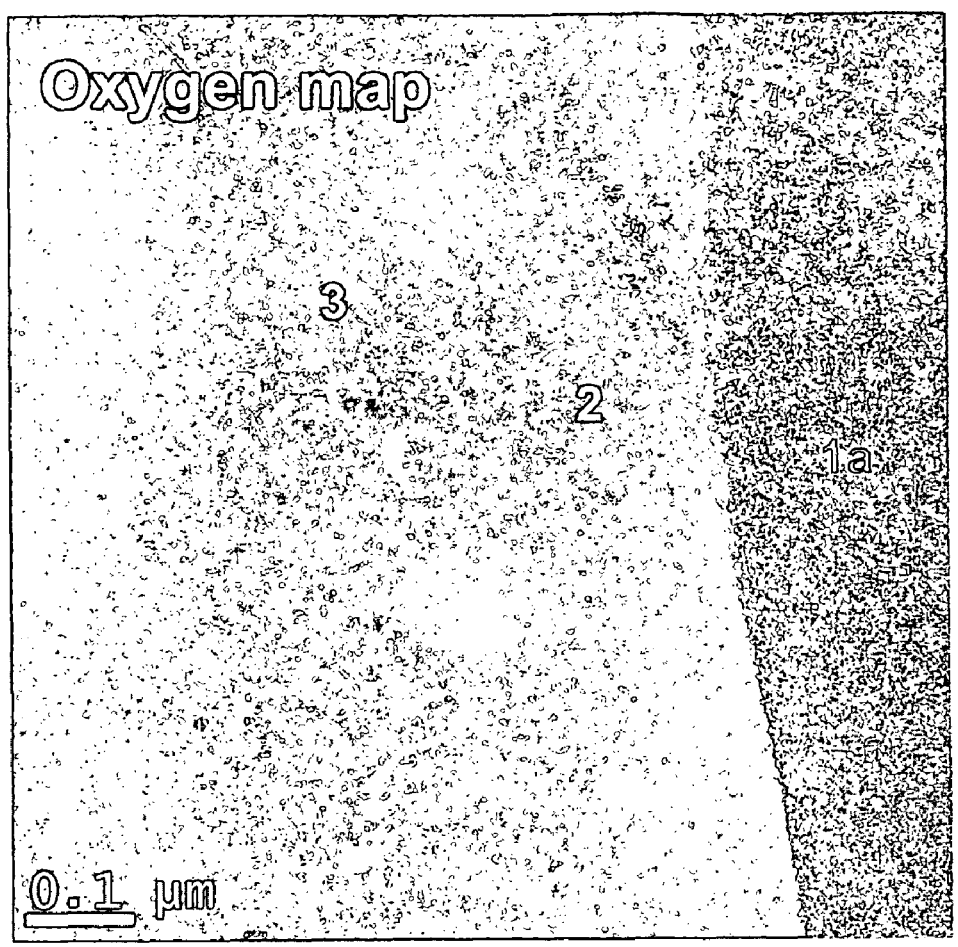
FIG. 38 shows an oxygen map of an AIC seed layer after 30 seconds of annealing in a hydrogen atmosphere at 1130° C.
Figure 39:
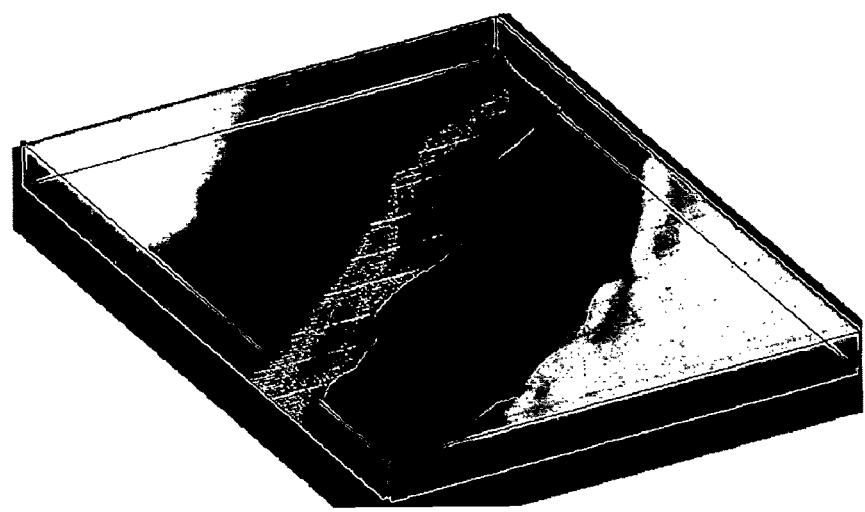
FIG. 39 shows a thickness map of the sample shown in FIG. 38.

In preferred embodiments, the seed layer 2a may be annealed in a hydrogen environment (i.e. an environment comprising hydrogen) at high temperatures, before growing an epitaxial layer 2b on top of the seed layer 2a. The annealing temperature is preferably higher than 1000° C., 1020° C., 1040° C., 1060° C., 1080° C., 1100° C., 1120° C., 1130° C. As a result of this annealing step, the thin layer of aluminum oxide initially present between a silicon island 3 or secondary crystallite 5 and the basic seed layer 2 may disappear, as illustrated in FIG. 38 (annealing at 1130° C.). However, in a thickness map (FIG. 39), holes or voids are visible at the interface between the basic seed layer 2 and an island 3. Based on the oxygen map and EELS (Electron Energy Loss Spectroscopy) and EFTEM (energy-Filtering TEM) it was found that no oxygen or aluminum was present inside the voids. The borders of the voids are along crystal planes of the silicon crystal.

Figure 40:
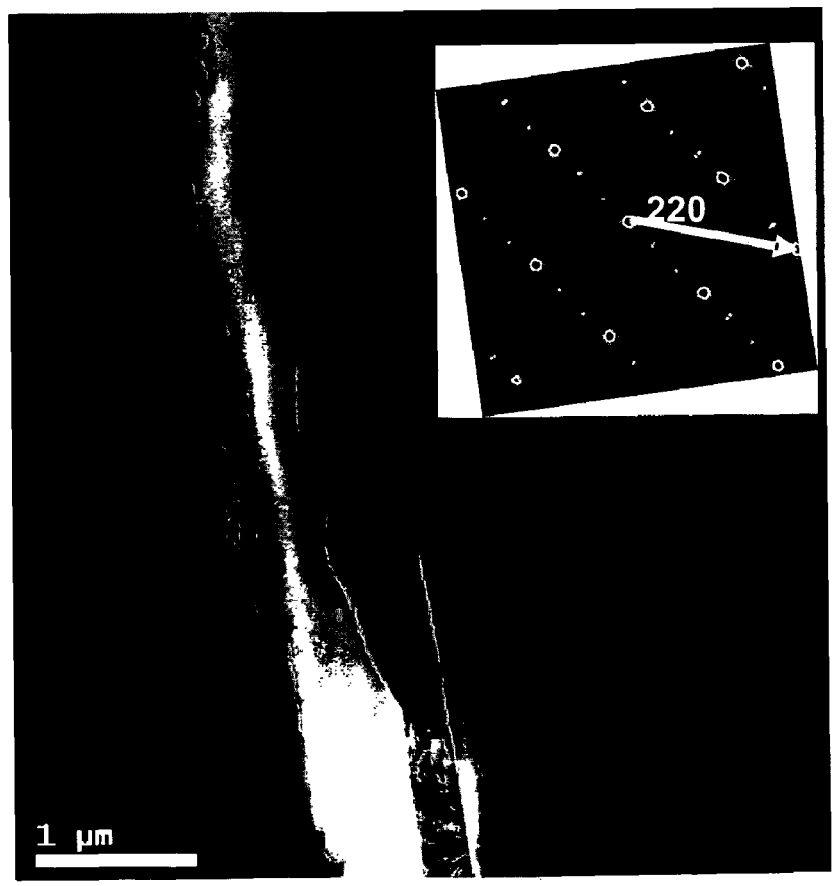
FIG. 40 is a cross section TEM image of a seed layer after hydrogen annealing.
Figure 41:
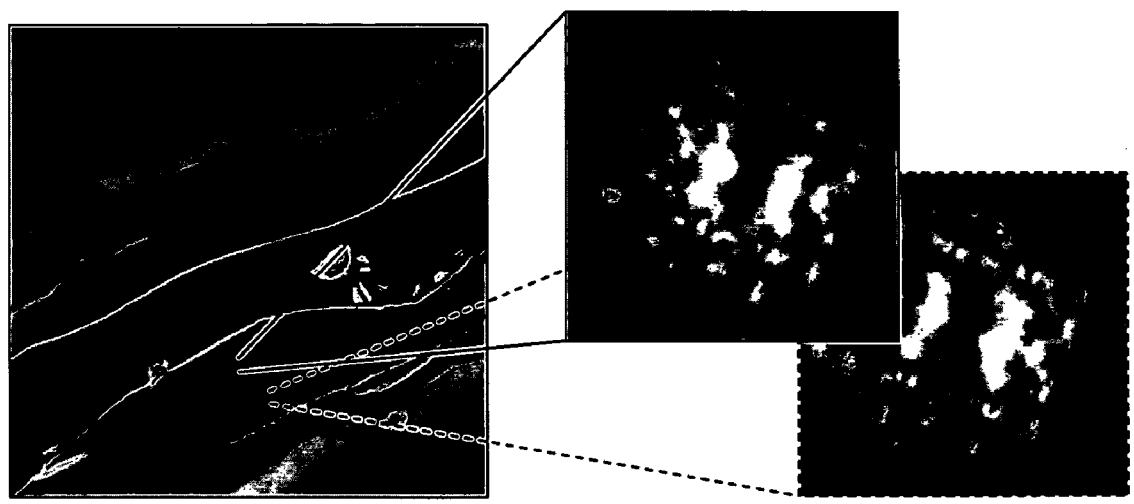
FIG. 41 shows a cross section TEM image and diffraction pattern measured at a secondary crystallite and at a basic seed layer.

After annealing in a hydrogen atmosphere, a correlation was found between the crystallographic orientation of the secondary crystallites 5 and islands 3 and the basic seed layer 2 as illustrated in FIG. 40. FIG. 40 is a cross section TEM image of a seed layer 2a after hydrogen annealing. At places indicated with a "+" the orientation of the secondary crystallites 5 is the same as the orientation of the underlying basic seed layer 2. At places indicated with a "−", the orientation of the secondary crystallites 5 is different from the orientation of the underlying basic seed layer 2. In this figure it can also be seen that the rims of the secondary crystallites 5 and islands 3 get rounded as a result of hydrogen annealing, thus leading to a smoother surface. Wherever an island 3 has the same orientation as the basic seed layer 2, voids can be found (see FIG. 41). They appear during annealing. FIG. 41 shows a cross section TEM image and diffraction pattern measured at a secondary crystallite 5 and at a basic seed layer 2. In between, two voids can be seen in the cross section TEM image. Both diffraction patterns are the same, showing that the orientation of the secondary crystallite 5 is the same as the underlying basic seed layer 2. These results may indicate that the high temperature hydrogen annealing step may lead to a reorientation of at least part of the secondary crystallites 5 such that the orientation of the secondary crystallites 5 becomes the same as the orientation of the underlying basic seed layer 2. This would probably result in a reduced surface roughness and less secondary crystallites in the sense of crystallites with a different orientation than the underlying polycrystalline silicon basic seed layer 2.

Both aspects, i.e. selectively removing the silicon islands 3 from the seed layer before epitaxial growth and annealing the seed layer in a hydrogen environment, may independently improve the quality of an epitaxial layer 2b grown on top of the seed layer. Both aspects may be combined.

All references cited herein, including but not limited to published and unpublished applications, patents, and literature references, are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

What is claimed is:

1. A method for forming a crystalline silicon layer on a face of a substrate, wherein the face is microrough prior to forming the crystalline silicon layer, comprising:
   reducing an amount of microroughness on a microrough face of a substrate, whereby a microflattened face is obtained;
   performing a metal induced crystallization process on the microflattened face of the substrate by depositing a metal, oxidizing the metal, depositing silicon on the metal and annealing the metal and the silicon, whereby a crystalline silicon layer is obtained on the microflattened face and whereby a metal layer is obtained on the crystalline silicon layer, the metal layer comprising secondary crystallites and silicon islands;
   removing the silicon islands, thereby using the metal layer as a mask; and
   removing the metal layer.

2. The method of claim 1, wherein removing the silicon islands comprises performing an etching step with an etching agent, wherein an etching speed of the etching agent for silicon and an etching speed of the etching agent for the metal are substantially the same.

3. The method of claim 1, wherein removing the silicon islands comprises performing an etching step with an etching agent having a faster etching speed for silicon than for the metal.

4. The method of claim 1, further comprising, before removing the silicon islands, performing an etching step for removing a metal oxide layer covering the silicon islands.

5. The method of claim 4, wherein the etching step for removing the metal oxide layer comprises etching with an etchant comprising at least one of HF and $H_3PO_4$.

6. The method of claim 1, further comprising, after removing the metal layer, a step of annealing at a temperature higher than 1000° C., whereby the surface of a seed layer comprising the secondary crystallites is smoothed.

7. The method of claim 6, wherein the annealing step is performed in a hydrogen atmosphere.

8. The method of claim 1, wherein the metal induced crystallization process comprises an aluminum induced crystallization process.

9. The method of claim 1, wherein reducing the amount of microroughness comprises depositing a microflattening layer on the microrough face.

10. The method of claim 9, wherein the microflattening layer is a dielectric layer.

11. The method of claim 1, wherein the substrate comprises at least one material selected from the group consisting of a ceramic material, glass, a glass-ceramic material, mullite, alumina, and silicon nitride.

12. The method of claim 1, further comprising:
 epitaxially depositing a silicon layer on the crystalline silicon layer; and
 constructing a solar cell from the substrate with the crystalline silicon layer and the epitaxially deposited silicon layer.

* * * * *